United States Patent
Leyrer et al.

(10) Patent No.: US 7,443,900 B2
(45) Date of Patent: Oct. 28, 2008

(54) LASER GAIN MEDIUM FOR SOLID STATE DYE LASERS

(75) Inventors: Reinhold J. Leyrer, Dannstadt (DE); Holger Schoepke, Neckargemuend (DE); Christoph Hamers, Ludwigshafen (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 279 days.

(21) Appl. No.: 10/525,796

(22) PCT Filed: Aug. 29, 2002

(86) PCT No.: PCT/EP02/09657
§ 371 (c)(1),
(2), (4) Date: Feb. 25, 2005

(87) PCT Pub. No.: WO2004/021531
PCT Pub. Date: Mar. 11, 2004

(65) Prior Publication Data
US 2005/0249257 A1    Nov. 10, 2005

(51) Int. Cl.
*H01S 3/20*    (2006.01)
(52) U.S. Cl. .............................. 372/53; 372/51; 372/54
(58) Field of Classification Search .............. 372/51–54
See application file for complete search history.

(56) References Cited

U.S. PATENT DOCUMENTS 3,771,065 A * 11/1973 Goldberg et al. .............. 372/53
5,788,880 A     8/1998 Schierlinger et al.
6,141,367 A * 10/2000 Fan et al. ....................... 372/53

OTHER PUBLICATIONS

W. Cao et al. "Mirrorless lasing in liquid crystalline materials", Proceedings of SPIE vol. 4642, pp. 55-61. Jan. 2002.*
Cao, W. et al.: "Mirrorless lasing in liquid crystalline materials" Organic Photonic Materials and Devices IV, vol. 4642, pp. 55-61, Jan. 2002. XP008015687.

* cited by examiner

*Primary Examiner*—Minsun Harvey
*Assistant Examiner*—Xnning Niu
(74) *Attorney, Agent, or Firm*—Oblon, Spivak, McClelland, Maier & Neustadt, P.C.

(57) ABSTRACT

The present invention relates to a laser gain medium comprising at least one active species adapted to be stimulated to emit laser light within a predetermined wavelength range and optical feedback means defining a resonator for said laser light. The feedback means comprise at least one substantially solid cholesteric layer having a substantially planar texture exhibiting selective reflection of light defined by a reflection band tuned to said predetermined wavelength range.

9 Claims, 2 Drawing Sheets

LASER GAIN MEDIUM FOR SOLID STATE DYE LASERS

BACKGROUND OF THE INVENTION

The present invention relates to solid state dye lasers and especially to a gain medium for solid state dye lasers comprising at least one cholesteric liquid crystalline polymer layer which provides distributed feedback for laser light emitted in the gain medium.

Laser devices are used in all areas of science and technology to generate coherent electromagnetic radiation in the infrared, visible or ultraviolet region the spectrum, i.e. approximately at wavelengths between 300 and 1800 nm. Lasers operate using the principle of light amplification by stimulated emission of radiation. If light is incident on an excited species, they may be stimulated to emit their energy as additional light with the same frequency, phase, polarisation and direction as the incident light. As the converse process, i.e. stimulated absorption of unexcited species, is also possible in a given sample, net amplification only occurs when the excited species outnumber the unexcited species, i.e. when an "inversion" of the atomic levels is established. Emission of laser light requires an excitable active species, e.g. a dye, which exhibits strong stimulated emission of radiation. Further, optical feedback means must be provided which act as a resonator for laser light emitted by the active species. The simplest resonator consists of two opposing mirrors arranged on opposite sides of a medium containing the active species which is conventionally denoted "gain medium".

Lasers are conventionally classified according to the type of gain medium used, e.g. gases, dyes, solid state semi conductor, and others.

Among those, dye lasers are of particular interest in many technical fields because they provide a broad tuneability of the emitted laser light over the spectral range mentioned above and their pumping methods, i.e. the methods for exciting the active species, are rather flexible. Commonly, excitation of the dye is achieved by means of so-called optical pumping using a source of energy such as a flash lamp or a pump laser. Typical pump lasers are nitrogen, argon iron, and frequency doubled Nd:YAG (neodymium/yttrium-aluminum-garnet). Dye lasers can be operated in either continuous-wave (CW) mode with continuous powers of typically up to 100 mW with very narrow line width or in pulsed mode with energies up to 1 J and pulse durations in the femto seconds range.

While most dye lasers operate with a liquid gain medium, solid-state dye lasers have also been developed, a laser assembly where the laser dyes are incorporated e.g. in a solid polymer matrix such as polymethyl methacrylate (PMMA). Solid state gain media overcome some of the disadvantages of liquid gain media such as handling problems and health or environmental hazards associated with many laser dyes and solvents commonly employed.

As an alternative to using end mirrors to define an optical cavity, mirrorless dye lasers with optical feedback distributed throughout the gain medium are known. Distributed feedback is commonly used in semiconductor or dye lasers, especially, when single mode operation is required (e.g. Shank et al. "Tunable distributed-feedback dye laser", Applied Physics Letters, 18, 152 (1971)). The distributed feedback is obtained by a gain medium exhibiting a spatial modulation in optical properties such as refractive index or gain in the direction of light propagation through the medium. A common method to obtain a periodic modulation in the gain medium is to interfere two coherent pump laser beams. Then, the output wavelength of stimulated laser light is proportional to the periodicity of the interference pattern. The laser emission wavelength can be tuned e.g. by varying the angle between the pump laser beams.

In U.S. Pat. No. 3,771,065, a liquid gain medium for dye lasers has been suggested consisting of a laser dye dissolved in a cholesteric liquid crystal (CLC) which provides distributed feedback. Such gain media benefit from special optical properties of the cholesteric or "chiral nematic" phase of certain liquid crystals: CLC's develop a helical superstructure characterized by a local nematic director which is perpendicular to the helix axis but varies linearly with its position along the helix axis. The pitch, i.e. the spatial period, is determined by the concentration and the helical twisting power of the chiral constituents. As a consequence of the periodicity of the helical cholesteric structure and the birefringence of the liquid crystal, for a range of wavelengths, light propagation along the helix axis is forbidden for one of the normal modes. Thus incident light of a "forbidden" wavelength is strongly reflected. The edges of this relection band are at wavelengths which are equal to the refractive indices times the helical pitch (c. f. deGennes, "The physics of liquid crystals", Clarendon Press, Oxford, 1974). Thus, if a dye doped CLC is aligned between two glass plates in the so-called planar texture, a "Bragg-type" phase grating is established throughout the CLC layer. Then laser emission is normal to the film plane and the output wavelength is set by the helical periodicity. By varying the temperature of the CLC host, the helical pitch of the CLC host can be changed, thereby the output wavelength of the dye laser can be tuned. Fluid CLC gain media are, however, subject to environmental perturbation, such as temperature, and impractical for many applications.

In U.S. Pat. No. 6,141,367, the disclosure of which is hereby incorporated by reference into the present application, a solid state dye laser has recently been described which has a solid gain medium doped with a fluorescent dye. It has been suggested to use a gain medium which includes a polymeric cholesteric liquid crystal disposed in a planar texture and frozen into a characteristic wavelength. The configuration of the dye laser including location means which allow for locating and orienting the gain medium relative to a pump laser are extensively described in this document. However, U.S. Pat. No. 6,141,367 does not disclose any specific polymeric CLC which can act as a suitable host material of a solid state dye laser medium.

Lasing in dye doped cholesteric liquid crystals has been demonstrated for the first time by Kopp et al. in *Opt.Lett.* 23, 1709, 1998 and Taheri et al. in *ALCOM Symposium on Chirality*, Cuyahoga Falls, February 1999. Subsequently, Finkelmann et al. have suggested in *Adv. Mater.* 2001, 13, No. 14, 1069-1072 to use an elastomeric cholesteric liquid crystal as a laser gain medium. Finkelmann et al. have demonstrated that mechanical stretching of an elastomeric cholesteric liquid crystal allows for tuning the lasing wavelenth. The elastomeric liquid crystal used by Finkelmann et al. comprises a polymeric network synthesized via a hydrosilylation of poly [oxy(methylsilylene] both with an achiral nematogenic monomer, said monomer having a mesogenic group comprising

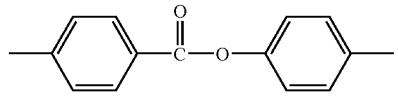

a chiral cholesterylcarbonate and 1,3,5 triallyloxybenzene as a crosslinking agent. As laser properties such as lasing threshold, line width, pulse duration etc. are strongly influenced by the optical properties of the distributed feedback gain medium, there is a need for polymer CLC's which prove particularly suitable for use in a solid state dye laser.

SUMMARY OF THE INVENTION

It is therefore an object of the present invention to provide an improved CLC based gain medium for solid state distributed feedback dye lasers. It is a further object of the present invention to provide a laser gain medium which allows to obtain a high degree of parallel orientation of individual helical axis, particularly when employing industrial scale production methods. It is still a further object of the invention to provide a polymeric CLC gain medium which allows for an easy tuneability of the laser output wavelength.

We have found that these objects are achieved by a laser gain medium comprising at least one active species adapted to be stimulated to emit laser light within a predetermined wavelength range, optical feedback means defining a resonator for said laser light, said feedback means comprising at least one substantially solid cholesteric layer having a substantially planar texture exhibiting selective reflection of light defined by a reflection band tuned to said predetermined wavelength range, said cholesteric layer being obtained from reactive cholesteric mixtures selected from mixtures comprising:

a) at least one cholesteric, polymerizable monomer; or
b) at least one achiral, nematic, polymerizable monomer and one chiral compound in an inert diluent; or
c) at least one cholesteric, crosslinkable oligomer or polymer selected from the group comprising cholesteric cellulose derivatives, propargyl-terminated cholesteric polyesters or polycarbonates, crosslinkable oligo- or polyorgano-siloxanes; or
d) crosslinkable cholesteric copolyisocyanates in a polymerizable diluent; or
e) chiral nematic polyesters having flexible chains whose cholesteric phase can be frozen in by rapid cooling to below the glass transition temperature, werein said mixtures b) do not comprise mixtures of an achiral, nematic, polymerizable monomer having a mesogenic group comprising

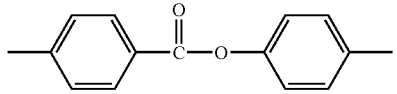

and a chiral cholesterylcarbonate and a crosslinking agent.

While the preferred gain medium of the invention comprises either one of mixtures a) to e), a suitable gain medium may also comprise mixtures of mixtures a) to e).

The production of cholesteric layers for gain media according to the invention offer a range of surprising advantages: The cholesteric helices, particularly of mixtures a) and b), can be oriented with particular advantage when dilute cholesteric solutions are used. Post-orientation of the cast (as yet unpolymerized and uncrosslinked) layer in order to align the cholesterics is often unnecessary. The cholesteric layers produced possess an extremely homogeneous layer thickness and can be produced in a reproducible manner. The invention makes cost-effective production of solid CLC laser gain media possible.

The cholesteric mixture is preferably applied with a diluent fraction of from about 5 to 95% by weight, in particular from about 30 to 80% by weight, preferably from about 40 to 70% by weight and, with particular preference, from about 55 to 60% by weight, based in each case on the overall weight of the mixture that is to be applied.

The mixtures of the invention may be employed in a pourable form, e.g. mixtures a), b) and c) in an inert diluent and mixture d) in a polymerizable diluent. For a detained description of methods for producing solid cholesteric polymer layers or films from mixtures a), b), c) and d), reference is made to International Patent application WO 99/1173.3 (corresponding to U.S. Ser. No. 09/486,695), the disclosure of which is incorporated herin by reference.

Preferred monomers of group a) are described in DE-A-196 02 848, the full content of which is incorporated herein by reference. In particular, the monomers a) embrace at least one chiral, liquid-crystalline, polymerizable monomer of the formula I $$[Z^1\text{-}Y^1\text{-}A^1\text{-}Y^2\text{-}M^1\text{-}Y^3\text{—}]_n X \qquad (I)$$

where $Z^1$ is a polymerizable group or a radical which carries a polymerizable group, $Y^1, Y^2, Y^3$ independently are chemical bonds, oxygen, sulfur,

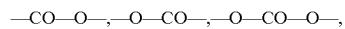

$A^1$ is a spacer, $M^1$ is a mesogenic group,

X is an n-valent chiral radical,

R is hydrogen or $C_1$-$C_4$-alkyl, n is 1 to 6, and $Z^1, Y^1, Y^2, Y^3, A^1$ and $M^1$ can be identical or different if n is greater than 1.

Preferred radicals $Z^1$ are:

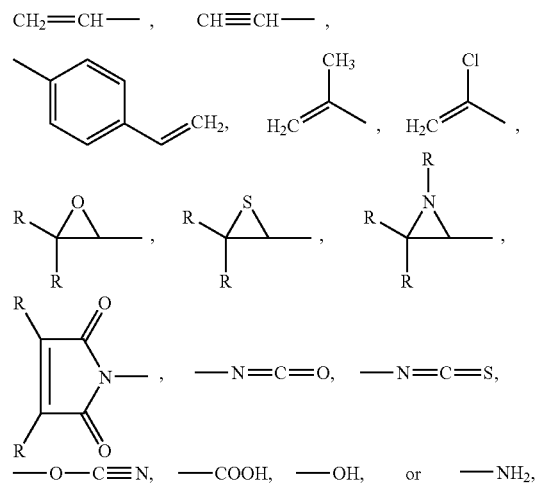

where each R can be identical or different and is hydrogen or $C_1$-$C_4$-alkyl, such as methyl, ethyl, n-propyl, isopropyl, n-butyl, isobutyl, sec-butyl or tert-butyl. Of the reactive polymerizable groups, the cyanates are able to trimerize spontaneously to cyanurates and are therefore preferred. Polymerization of the other groups indicated requires further compounds having complementary reactive groups. Isocyanates, for example, are able to polymerize with alcohols to give urethanes and with amines to give urea derivatives. Similar comments apply to thiiranes and aziridines. Carboxyl groups can be condensed to give polyesters and polyamides. The maleimido group is particularly suitable for free-radical copolymerization with olefinic compounds such as styrene. Said complementary reactive groups can be present either in a second compound of the invention, which is mixed with the first, or can be incorporated into the polymeric network by means of auxiliary compounds containing 2 or more such complementary groups.

Particularly preferred groups $Z^1$-$Y^1$ are acrylate and methacrylate.

$Y^1$-$Y^3$ can be as defined above, the term a chemical bond meaning a single covalent bond.

Suitable spacers $A^1$ are all groups known for this purpose. The spacers contain generally 1 or more, e.g. from 2 to 30, preferably 1 to 12 or 2 to 12 carbon atoms and consist of linear aliphatic groups. They may be interrupted in the chain by nonadjacent O, S, NH or NCH$_3$, for example. Other suitable substituents for the spacer chain are fluorine, chlorine, bromine, cyano, methyl and ethyl.

Examples of representative spacers are:

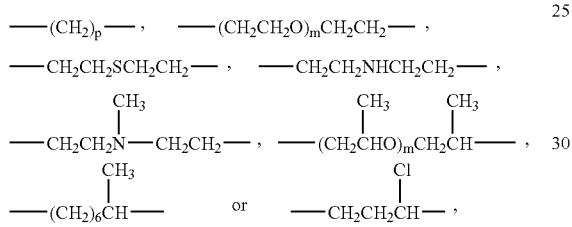

where
m is 1 to 3 and
p is 1 to 12.

The mesogenic group $M^1$ preferably has the structure $$(T-Y^8)_s-T$$

where $Y^8$ is a bridge in accordance with one of the definitions of $Y^1$, s is 1 to 3 and T is identical or different at each occurrence and is a divalent isocycloaliphatic, heterocycloaliphatic, isoaromatic or heteroaromatic radical.

The radicals T can also be ring systems substituted by $C_1$-$C_4$-alkyl, fluorine, chlorine, bromine, cyano, hydroxyl or nitro. Preferred radicals T are:

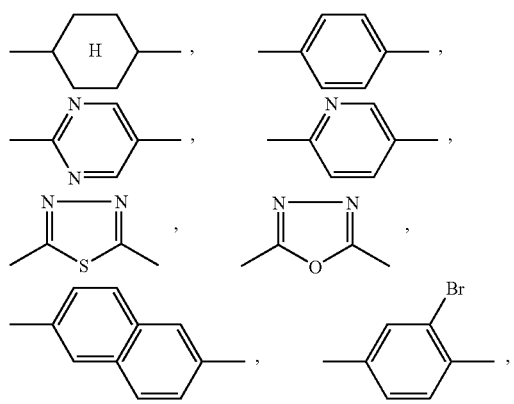

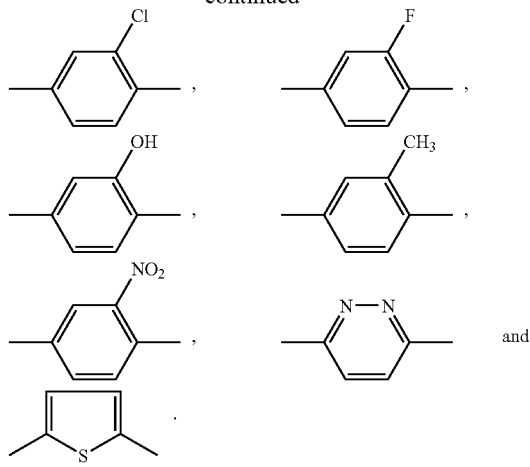

Particular preference is given to the following mesogenic groups $M^1$:

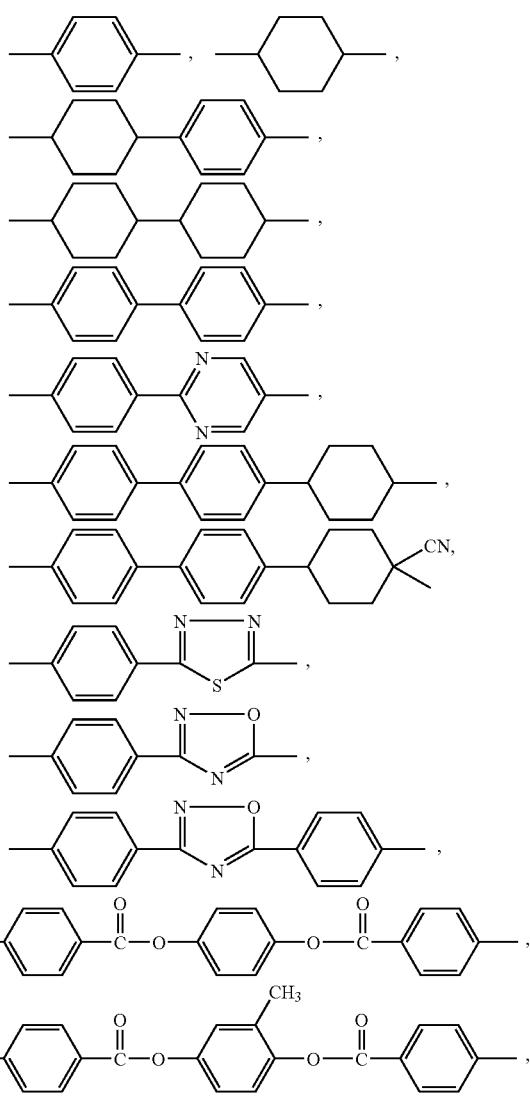

-continued

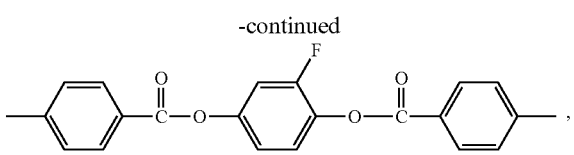

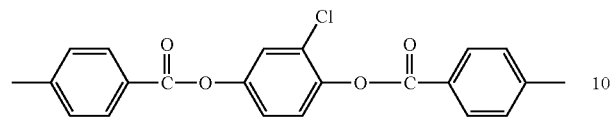

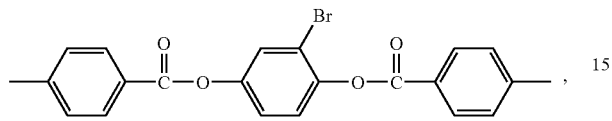

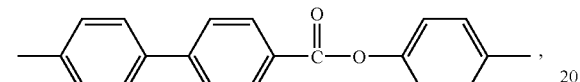

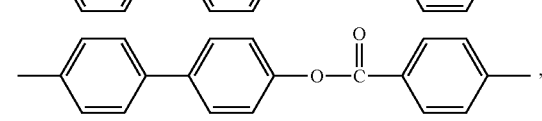

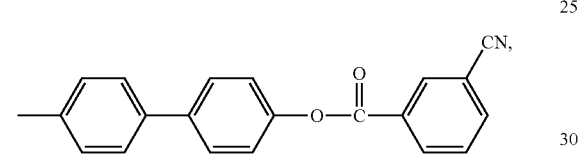

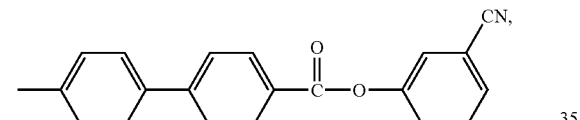

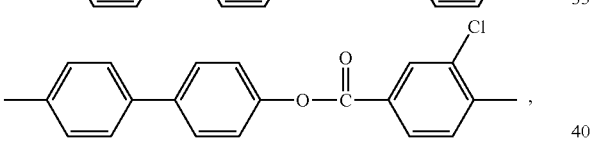

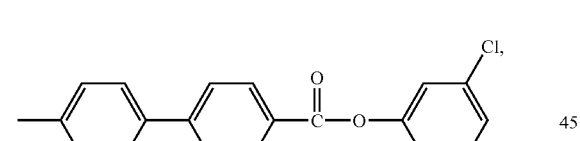

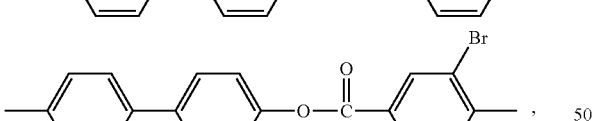

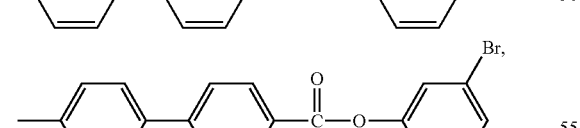

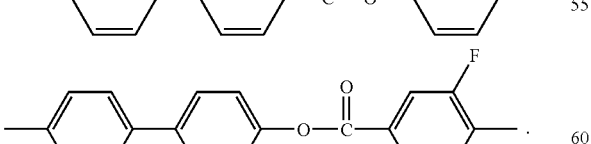

Of the chiral radicals X of the compounds of the formula I particular preference is given, not least on account of their availability, to those derived from sugars, from binaphthyl or biphenyl derivatives and from optically active glycols, dialcohols or amino acids. In the case of the sugars, particular mention should be made of pentoses and hexoses and derivatives thereof.

Examples of radicals X are the following structures, the lines at the end in each case denoting the free valences.

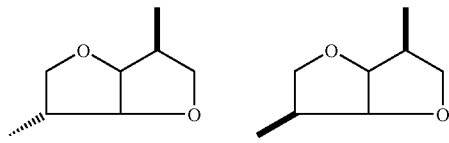

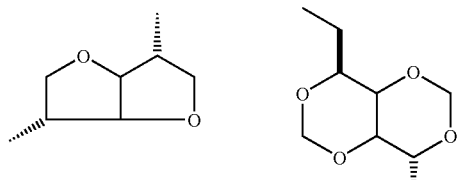

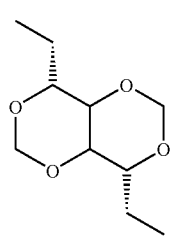

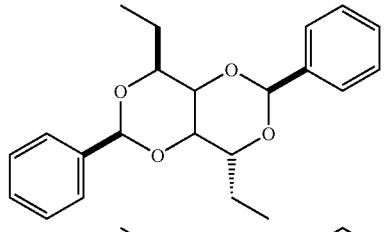

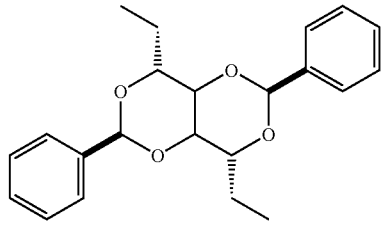

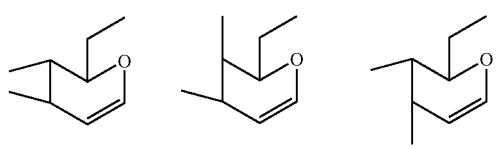

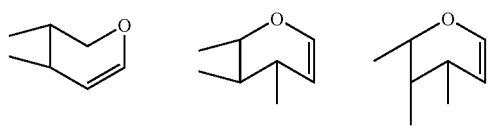

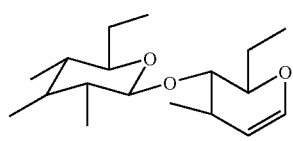

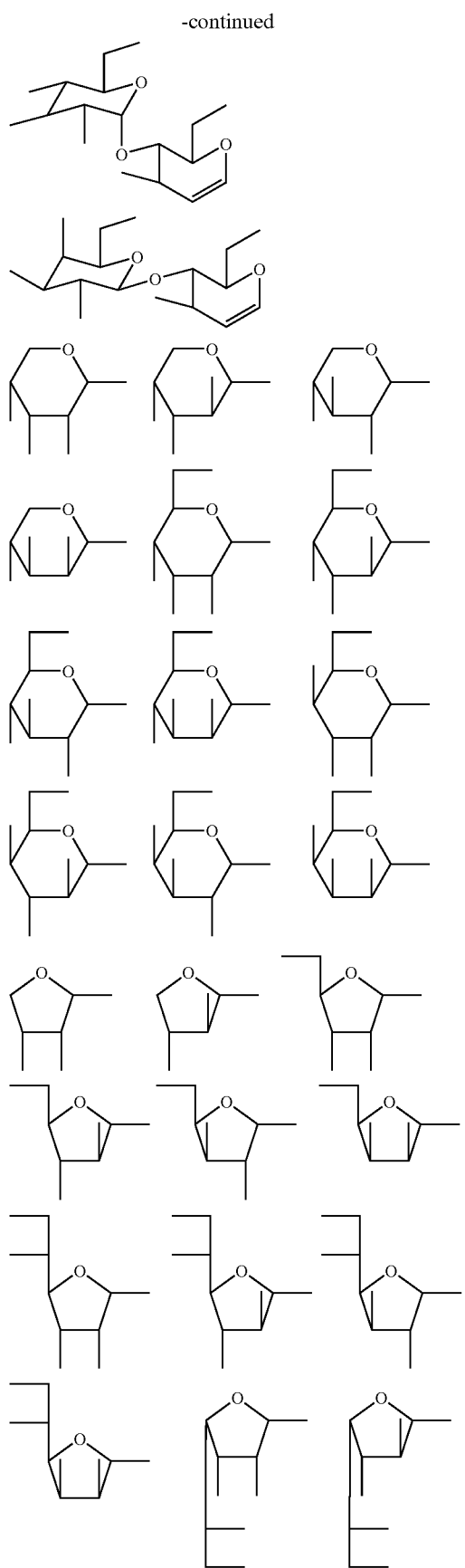
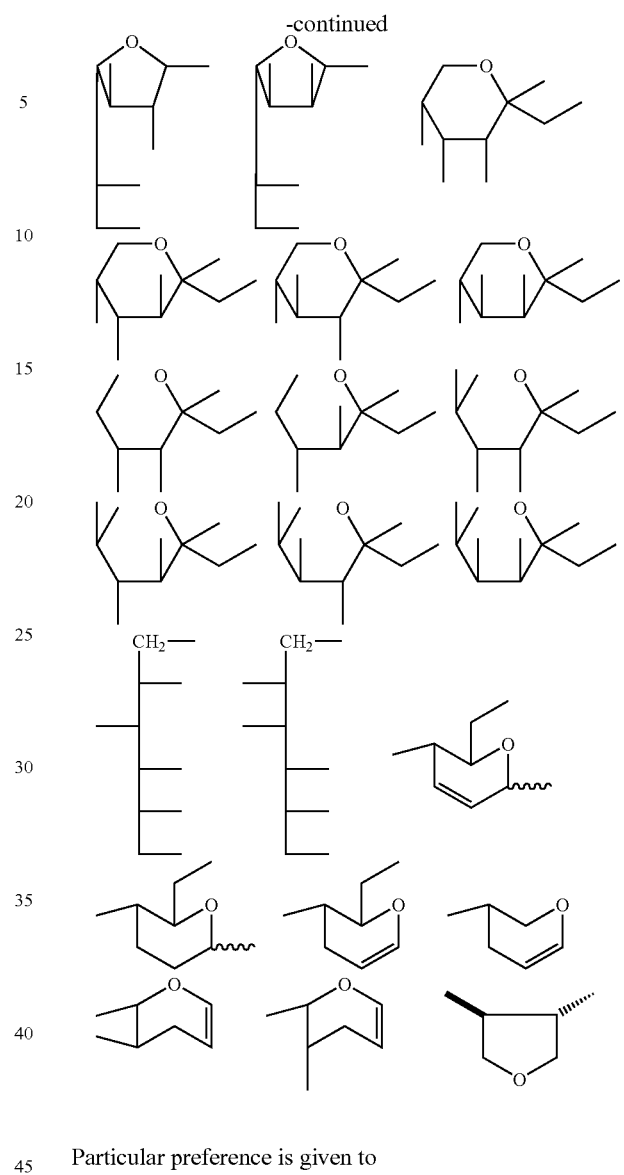
Particular preference is given to
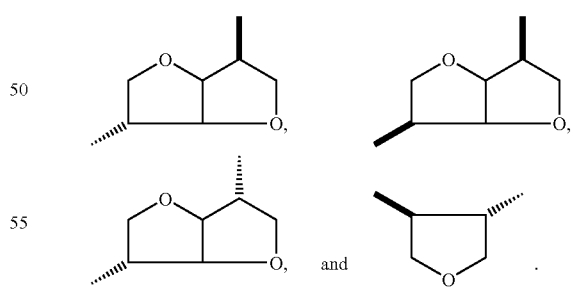
Also suitable, furthermore, are chiral groups having the following structures:
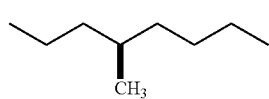

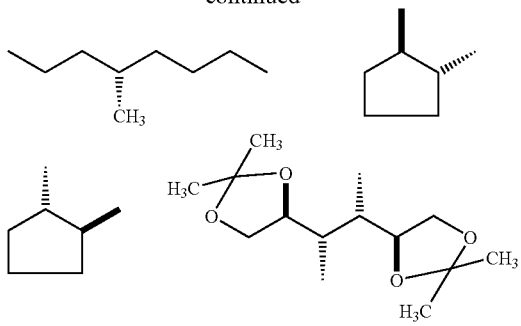

Further examples are set out in the German Application P 43 42 280.2.

n is preferably 2.

As preferred monomers of group b), the polymerizable mixture in the process of the invention includes at least one achiral liquid-crystalline polymerizable monomer of the formula II $$Z^2-Y^4-A^2-Y^5-M^2-Y^6-A^3-(-Y^7-Z^3)_n \qquad (II)$$

where $Z^2, Z^3$ are identical or different polymerizable groups or radicals which contain a polymerizable group, n is 0 or 1

$Y^4, Y^5, Y^6, Y^7$ independently are chemical bonds, oxygen, sulfur,

—CO—O—, —O—CO—, —O—CO—O—,

—CO—N(R)— or —N(R)—CO—, $A^2, A^3$ are identical or different spacers and $M^2$ is a mesogenic group.

The polymerizable groups, bridges $Y^4$ to $Y^7$, the spacers and the mesogenic groups are subject to the same preferences as the corresponding variables of the formula I.

The crosslinkable achiral liquid-crystalline monomers, in particular those which make it possible to prepare liquid-crystalline polymers having relatively high crosslinking density, may also be compounds of the formula

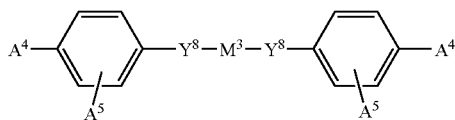

where $A^4$ and $A^5$ are identical or different and are each a crosslinkable group;

the radicals $Y^8$ are identical or different, preferably identical, and are each a single bond, —O—, —S—, —C═N—, —O—CO—, —CO—O—, —O—CO—O—, —CO—NR—, —NR—CO—, —NR—, —O—CO—NR, —NR—CO—O—, —CH$_2$—O— or —NR—CO—NR, in which R is H or C$_1$-C$_4$-alkyl; and $M^3$ is a mesogenic group.

These compounds are notable for the fact that they are capable of forming a liquid-crystalline phase and stabilize this phase particularly well and permanently owing to their increased crosslinkable group content.

Preferably $A^5$ is ortho to $A^4$ at each occurrence.

Preference is likewise given to compounds where $A^4$ and $A^5$ are each, independently of one another, a group of the formula $$Z-Y^8-(Sp)_n-$$

where

Z is a crosslinkable radical;

$Y^8$ is as defined above;

Sp is a spacer having from 1 to 30 carbon atoms, in which the carbon chain may be interrupted by ether oxygen, thioether sulfur or nonadjacent imino or C$_1$-C$_4$-alkylimino groups; and n is 0 or 1.

$A^4$ and $A^5$ are preferably identical.

According to a preferred embodiment Z is selected from:

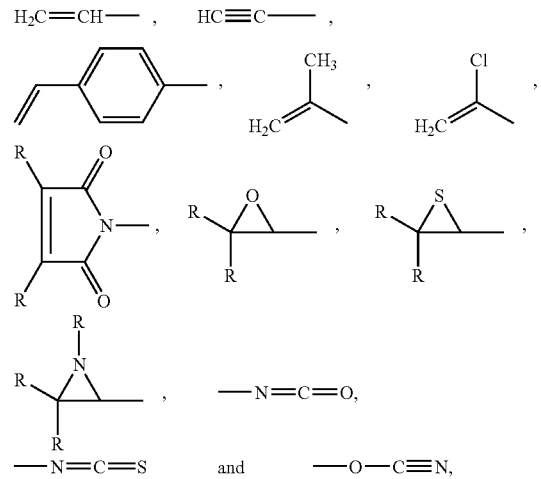

where the radicals R are each, independently of one another, C$_1$-C$_4$-alkyl, for example methyl, ethyl, n- or i-propyl or n-, i- or t-butyl.

According to another preferred embodiment Sp is selected from:

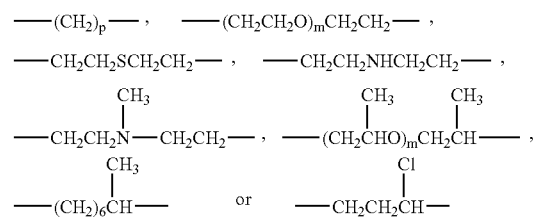

where m is from 1 to 3 and p is from 1 to 12.

According to another preferred embodiment $M^3$ is selected from groups of the general formula III:

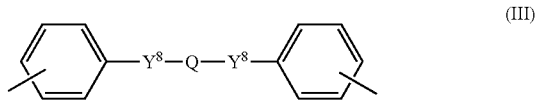

(III)

where
Y⁸ is as defined above, and
Q is substituted or unsubstituted alkylene, such as linear or branched $C_1$-$C_{12}$-alkylene, or a substituted or unsubstituted aromatic bridging group.

Preferred aromatic bridging groups are selected from

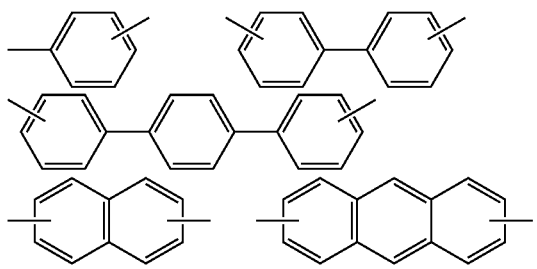

and substituted analogs thereof. Substituted analogs of said bridging groups can carry from 1 to 4 identical or different substituents per aromatic ring, preferably one or two substituents per ring or per bridging group. Suitable substituents are selected from $C_1$-$C_4$-alkyl as defined above, nitro, halogen, such as F, Cl, Br, I, phenyl or $C_1$-$C_4$-alkoxy, the alkyl radical being defined as above.

A detained description of compounds of formula III and methods for producing such compounds can be found in German patent application DE 100 16 524 the disclosure of which is incorporated herein by reference.

In addition to the achiral compounds, the mixture according to b) includes at least one chiral compound. The chiral compound brings about the twisting of the achiral liquid-crystalline phase to form a cholesteric phase. In this context, the extent of twisting depends on the twisting power of the chiral dopant and on its concentration. Consequently, therefore, the pitch of the helix and, in turn, the reflectance wavelength depend on the concentration of the chiral dopant. As a result, it is not possible to indicate a generally valid concentration range for the dopant. The dopant is added in the amount at which the cholesteric layer has a reflection band with edges at the desired lasing wavelength.

Preferred chiral compounds are either those of the formula Ia

or those of formula Ib

where $Z^1$, $Y^1$, $Y^2$, $Y^3$, $A^1$, X and n are as defined above in formula I, $M^a$ is a divalent radical which comprises at least one heterocyclic or isocyclic ring system, and $X^2$ is a cholesteryl radical or a derivative thereof.

The moiety $M^a$ here is similar to the mesogenic groups described, since in this way particularly good compatibility with the liquid-crystalline compound is achieved. $M^a$, however, need not be mesogenic, since the compound Ia is intended merely by virtue of its chiral structure to bring about the appropriate twisting of the liquid-crystalline phase. Preferred ring systems present in $M^a$ are the abovementioned structures T, preferred structures $M^a$ being those of the abovementioned formula $(T-Y^8)_s$-T. Further monomers and chiral compounds of group b) are described in WO 97/00600 and its parent DE-A-195 324 08, the full content of which is expressly incorporated herein by reference.

A preferred moiety $X^2$ is a chiral cholesterylcarbonate of formula

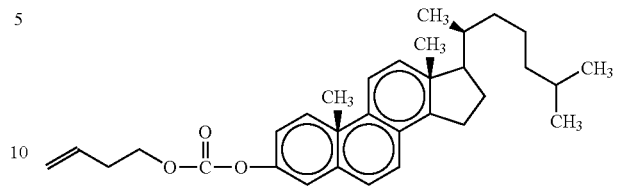

Preferred polymers of group c) are cholesteric cellulose derivatives as described in DE-A-197 136 38, especially cholesteric mixed esters of
(VI) hydroxyalkyl ethers of cellulose with
(VII) saturated, aliphatic or aromatic carboxylic acids and
(VIII) unsaturated mono- or dicarboxylic acids.

Particular preference is given to mixed esters in which the hydroxyalkyl radicals of component VI that are attached by way of ether functions are straight-chain or branched $C_2$-$C_{10}$-hydroxyalkyl radicals, especially hydroxypropyl and/or hydroxyethyl radicals. Component VI of the mixed esters of the invention preferably has a molecular weight of from about 500 to about 1 million. Preferably, the anhydroglucose units of the cellulose are etherified with hydroxyalkyl radicals in an average molar degree of substitution of from 2 to 4. The hydroxyalkyl groups in the cellulose can be identical or different. Up to 50% of them can also be replaced by alkyl groups (especially $C_1$-$C_{10}$-alkyl groups). One example of such a compound is hydroxypropylmethylcellulose.

Compounds which can be used as component VII of the mixed esters that are employable are straight-chain aliphatic $C_1$-$C_{10}$ carboxylic acids, especially $C_2$-$C_6$ carboxylic acids, branched aliphatic $C_4$-$C_{10}$ carboxylic acids, especially $C_4$-$C_6$ carboxylic acids, or straight-chain or branched halocarboxylic acids. Component VII can also comprise benzoic acid or aliphatic carboxylic acids with aromatic substituents, especially phenylacetic acid. Component VII is with particular preference selected from acetic, propionic, n-butyric, isobutyric and n-valeric acid, in particular from propionic, 3-chloropropionic, n-butyric and isobutyric acid.

Component VIII is preferably selected from unsaturated $C_3$-$C_{12}$ mono- or dicarboxylic acids or monoesters of such dicarboxylic acids, especially from α, β-ethylenically unsaturated $C_3$-$C_6$ mono- or dicarboxylic acids or monoesters of the dicarboxylic acids.

Component VIII of the mixed esters that are employable is with particular preference selected from acrylic, methacrylic, crotonic, vinylacetic, maleic, fumaric and undecenoic acid, especially from acrylic and methacrylic acid.

Component VI is preferably esterified with component VII and VIII in an average molar degree of substitution of from 1.5 to 3, in particular from 1.6 to 2.7 and with particular preference, from 2.3 to 2.6. Preferably about 1 to 30%, in particular from 1 to 20% or 1 to 10%, with particular preference, from about 5 to 7% of the OH groups of component VI are esterified with component VIII.

The proportion of component VII to component VIII determines the hue of the polymer.

Highly suitable polymers of group c), moreover, are the propargyl-terminated cholesteric polyesters or polycarbonates described in DE-A-197 17 371.

It is also possible to employ crosslinkable oligo- or poly-organo-siloxanes, as are known, for example, from EP-A-0 358 208, DE-A-195 41 820 or DB-A-196 19 460.

Among these compounds preference is given to polyesters or polycarbonates having at least one propargyl end group of the formula $R^3C\equiv C-CH_2-$, where $R^3$ is H, $C_1$-$C_4$-alkyl, aryl or $Ar-C_1$-$C_4$-alkyl (eg. benzyl or phenethyl) which is attached to the polyesters or polycarbonates directly or via a linker. The linker is preferably selected from

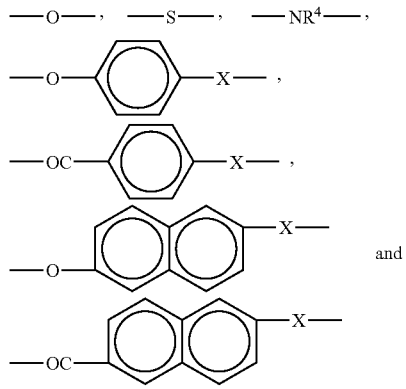

and (the propargyl group is attached to X), where $R^4$ is H, $C_1$-$C_4$-alkyl or phenyl, X is O, S or $NR^2$ and $R^2$ is H, $C_1$-$C_4$-alkyl or phenyl.

In the polyesters, the propargyl end group is preferably attached by way of

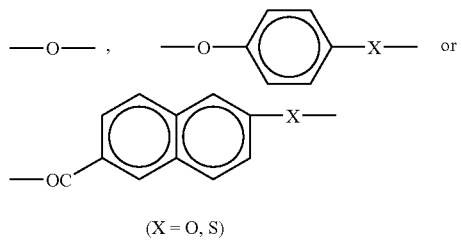

(X = O, S)

The polyesters preferably comprise
(IX) at least one aromatic or araliphatic dicarboxylic acid unit and/or at least one aromatic or araliphatic hydroxycarboxylic acid unit, and
(X) at least one diol unit.

Preferred dicarboxylic acid units are those of the formula

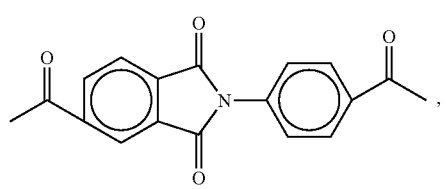

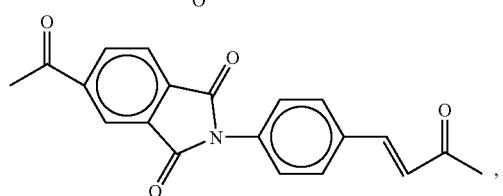

-continued

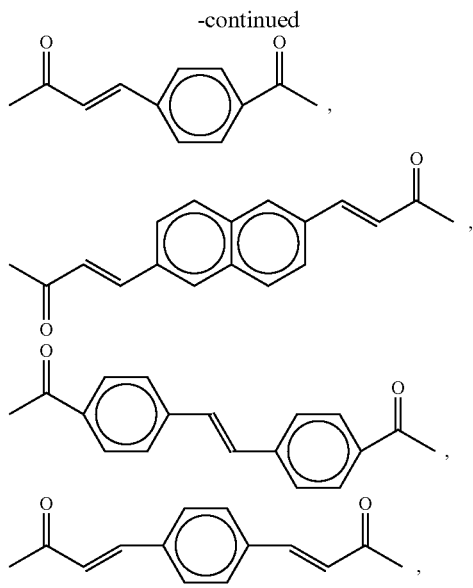

especially those of the formula

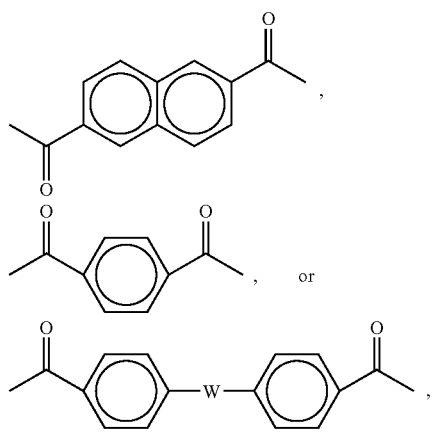

where each of the phenyls or the naphthyl can carry 1, 2 or 3 substituents selected independently from $C_1$-$C_4$-alkyl, $C_1$-$C_4$-alkoxy, halogen or phenyl, and where
W is NR, S, O, $(CH_2)_pO(CH_2)_q$, $(CH_2)_m$ or a single bond,
R is alkyl or hydrogen,
m is an integer from 1 to 15, and
p and q independently are integers from 0 to 10.

Preferred hydroxycarboxylic acid units are those of the formula

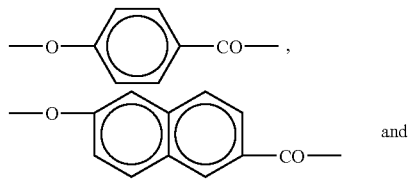

and

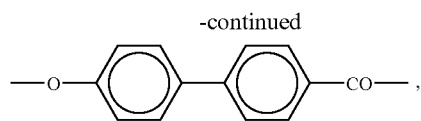
where each phenyl or the naphthyl can carry 1, 2 or 3 substituents selected independently from $C_1$-$C_4$-alkyl, $C_1$-$C_4$-alkoxy, halogen or phenyl.
Preferred diol units are those of the formula
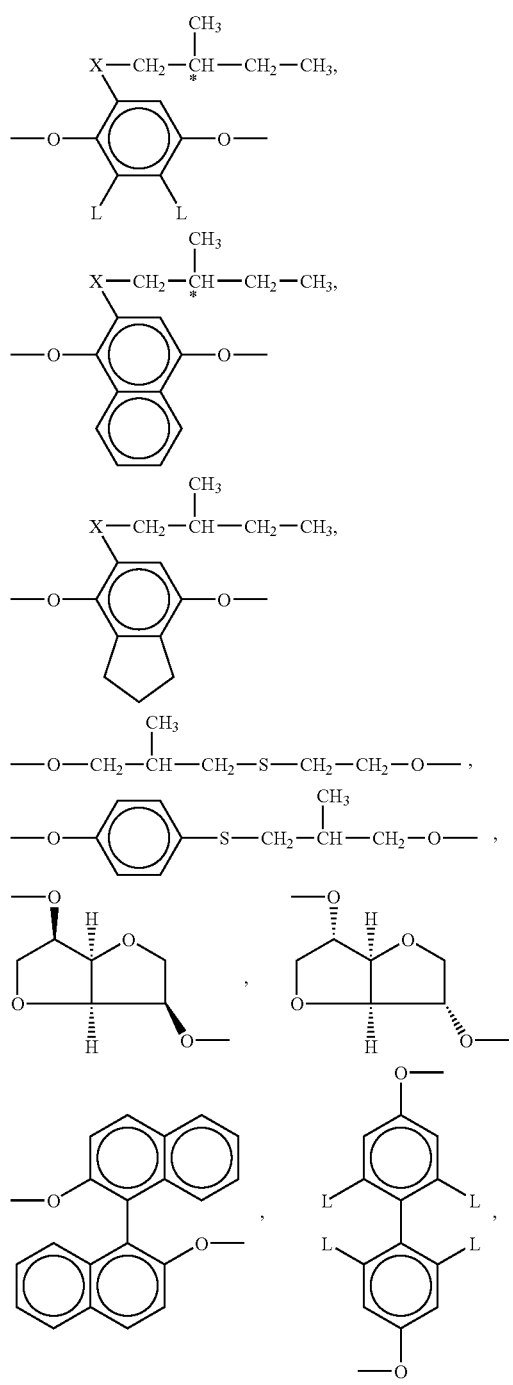
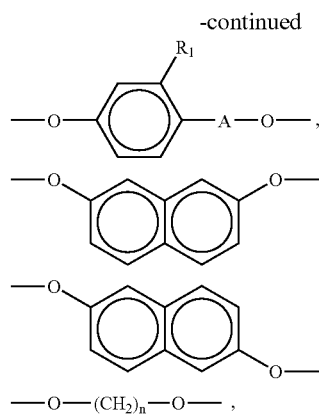
especially those of the formula
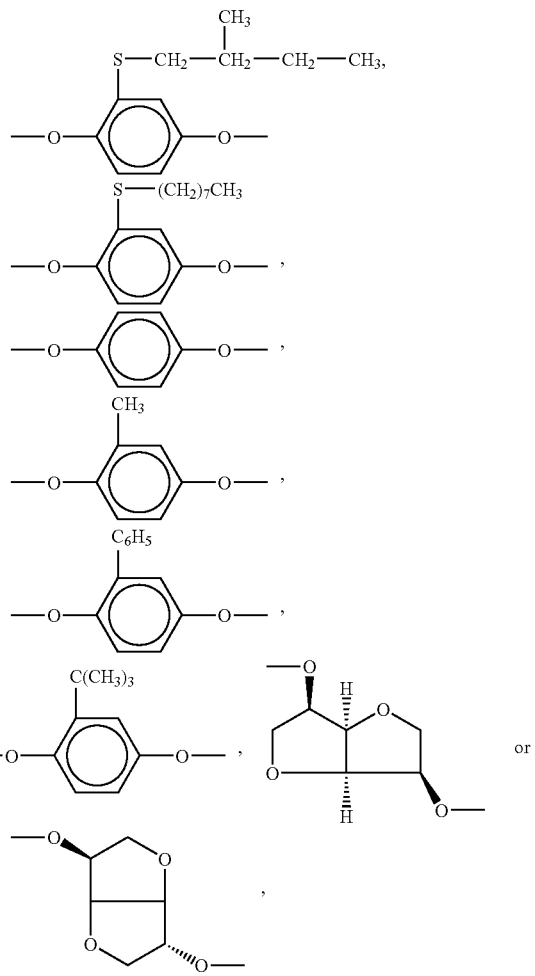
where
L is alkyl, alkoxy, halogen, COOR, OCOR, CONHR or NHCOR,
X is S, O, N, $CH_2$ or a single bond,
A is a single bond, $(CH_2)_n$, $O(CH_2)_n$, $S(CH_2)_n$, $NR(CH_2)_n$,

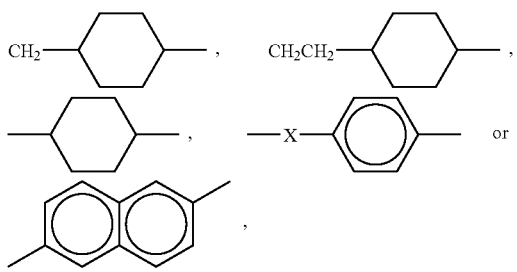

R is alkyl or hydrogen,
$R^1$ is hydrogen, halogen, alkyl or phenyl, and
n is an integer from 1 to 15.

Preference is given to polyesters comprising at least one dicarboxylic acid unit of the formula

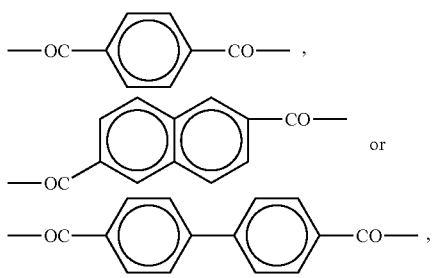

and at least one diol unit of the formula

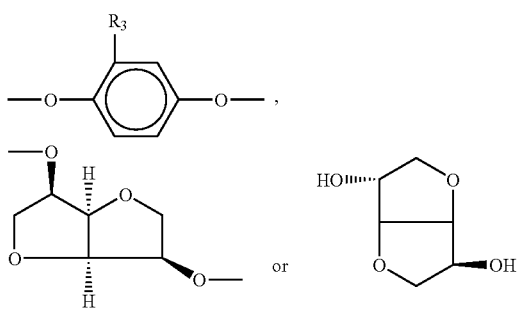

where $R^3$ is H, halogen, $C_1$-$C_4$-alkyl, especially $CH_3$ or $C(CH_3)_3$, or is phenyl.

Further preferred compounds are diesters of the formula P—Y—B—CO—O-A-O—CO—B—Y—P, where P is a propargyl end group of the above-defined formula, Y is O, S or $NR^2$ ($R^2$=$C_1$-$C_4$-alkyl), B is

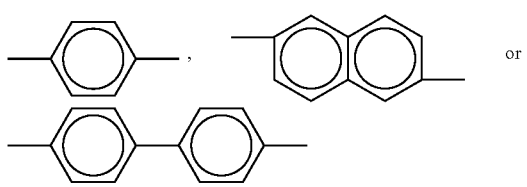

where each phenyl or the naphthyl can carry 1, 2 or 3 substituents selected independently from $C_1$-$C_4$-alkyl, $C_1$-$C_4$-alkoxy, halogen or phenyl, and A (together with the adjacent oxygens) is one of the abovementioned diol units.

Particularly preferred diesters are those of the above formula in which B is

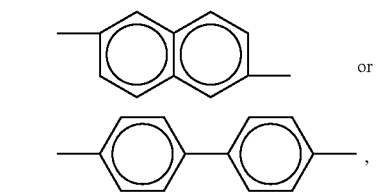

and especially diesters of the formula

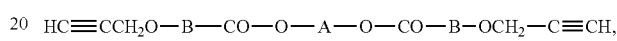

where (XI) B is 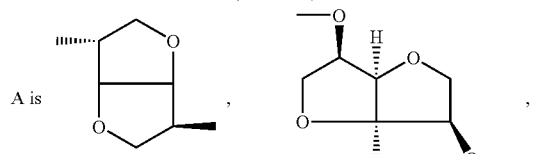 and

A is 

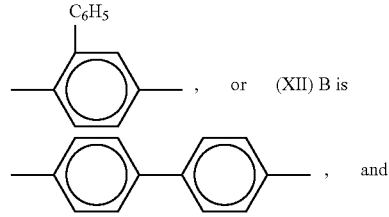, or (XII) B is

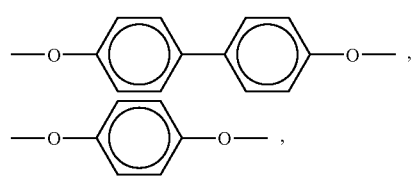, and

A is as defined under XI.

Further preferred compounds are polycarbonates comprising at least one incorporated diol unit of the above formulae, especially of the formulae -continued

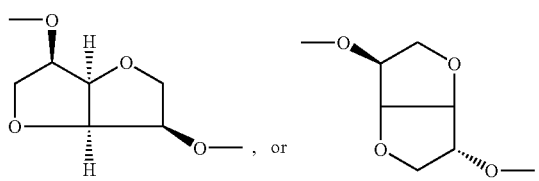

Preference is given here to those polycarbonates which comprise as diol units at least one mesogenic unit of the formula

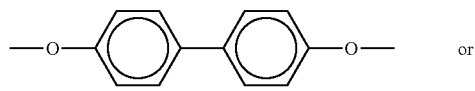 or

-continued

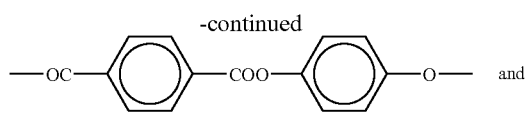 and at least one chiral unit of the formula

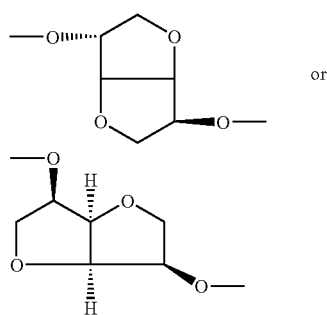

and, if desired, a nonchiral unit of the formula

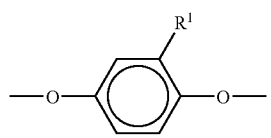

where $R^1$ is as defined above and in particular is H or $CH_3$.

Particularly preferred polycarbonates are those having propargyl end groups of the formula $HC{\equiv}CCH_2O-R^5-CO$, in which $R^5$ is

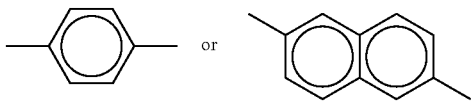

Further suitable polymers of group c) are cholesteric polycarbonates containing photoreactive groups even in a nonterminal position. Such polycarbonates are described in DE-A-196 31 658 and are preferably of the formula XIII

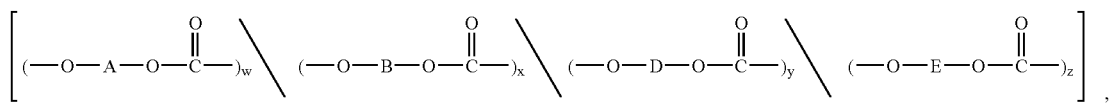

(XIII)

where the molar ratio w/x/y/z is from about 1 to 20/from about 1 to 5/from about 0 to 10/from about 0 to 10. Particular preference is given to a molar ratio w/x/y/z of from about 1 to 5/from about 1 to 2/from about 0 to 5/from about 0 to 5.

In the formula XIII

A is a mesogenic group of the formula

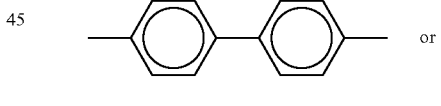 or

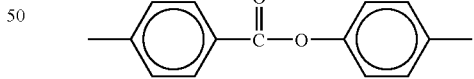

B is a chiral group of the formula

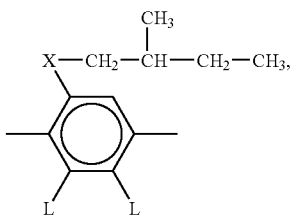

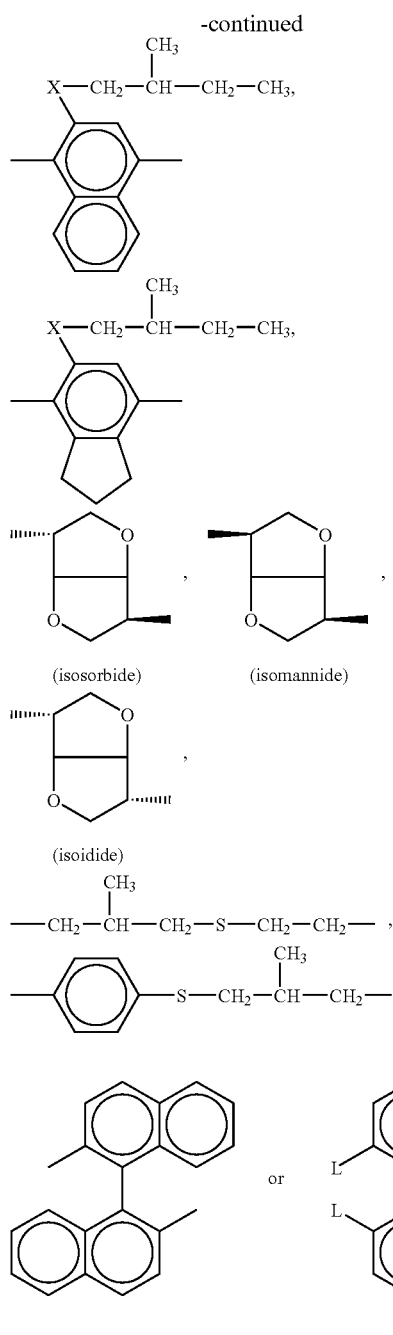

(isosorbide)   (isomannide)

(isoidide)

D is a photoreactive group of the formula

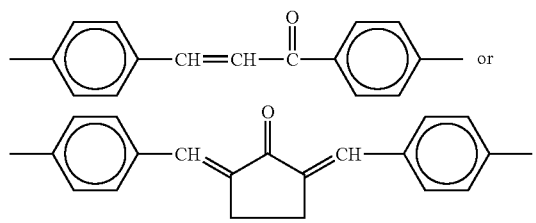

and

E is a further, nonchiral group of the formula

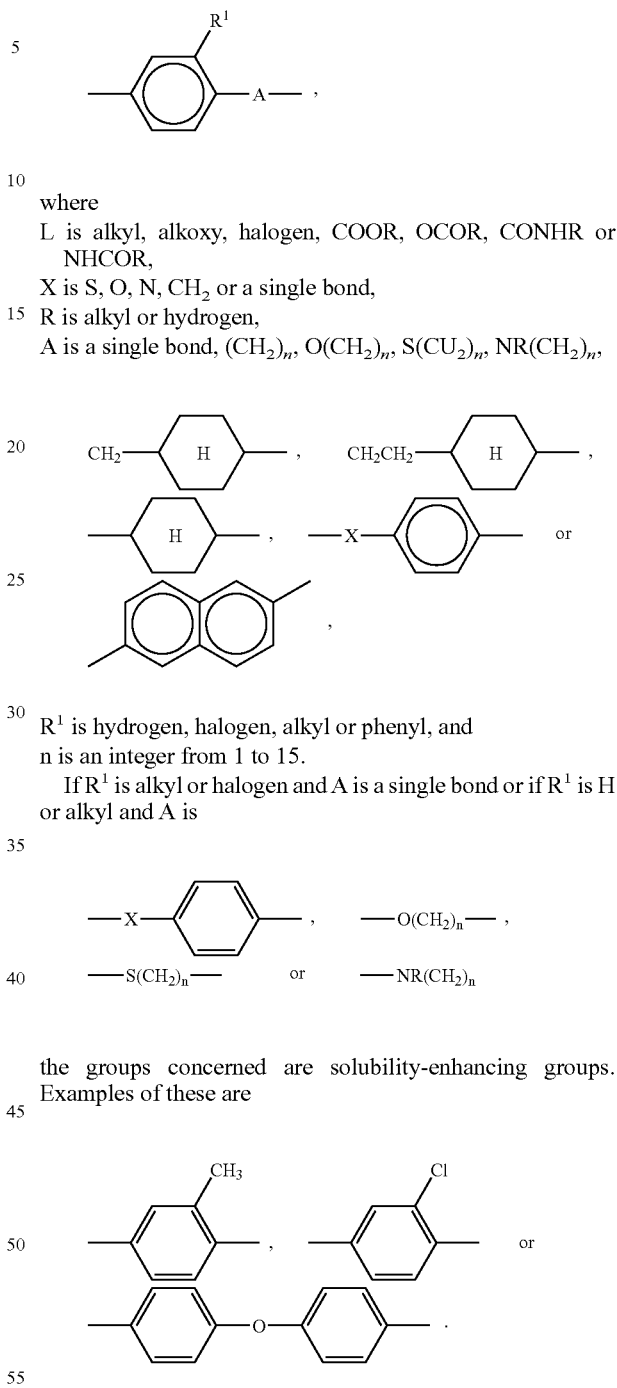

where
L is alkyl, alkoxy, halogen, COOR, OCOR, CONHR or NHCOR,
X is S, O, N, $CH_2$ or a single bond,
R is alkyl or hydrogen,
A is a single bond, $(CH_2)_n$, $O(CH_2)_n$, $S(CU_2)_n$, $NR(CH_2)_n$, $R^1$ is hydrogen, halogen, alkyl or phenyl, and
n is an integer from 1 to 15.
If $R^1$ is alkyl or halogen and A is a single bond or if $R^1$ is H or alkyl and A is the groups concerned are solubility-enhancing groups. Examples of these are Isosorbide, isomannide and/or isoidide is the preferred chiral component.

The proportion of the chiral diol structural units is preferably within the range from 1 to 80 mol-% of the overall content of diol structural units, with particular preference from 2 to 20 mol-%, depending on the desired interference hue.

Examples of preferred polymers of group d) are crosslinkable cholesteric copolyisocyanates as described in U.S. Pat. No. 08,834,745. Such copolyisocyanates feature repeating units of the formulae

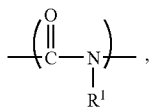
(III)

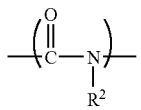
(IV)

and if desired of the formula

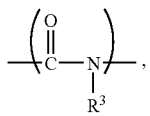
(V)

where
R$^1$ is a chiral aliphatic or aromatic radical,
R$^2$ is a crosslinkable radical and
R$^3$ is an achiral radical.

Unless stated otherwise, alkyl is to be understood here (both alone and in definitions such as alkoxy, dialkyl, alkylthio, etc.) as branched and unbranched $C_1$-$C_{12}$-alkyl, preferably $C_3$-$C_{12}$-, with particular preference $C_4$-$C_{10}$- and, in particular, $C_6$-$C_{10}$-alkyl.

R$^1$ is preferably selected from (chiral) branched or unbranched alkyl, alkoxyalkyl, alkylthioalkyl, cycloalkyl, alkylphenyl or $C_3$-$C_9$-epoxyalkyl radicals or radicals from esters of $C_1$-$C_6$ fatty acids with $C_1$-$C_6$-alkanols or $C_3$-$C_9$-dialkyl ketones. The ester radical may be attached to the nitrogen either via the fatty acid moiety or via the alkanol residue. The radical R$^1$ may have 1, 2 or 3 substituents, which are identical or different and are selected from alkoxy, di-$C_1$-$C_4$-alkylamino, CN or $C_1$-$C_4$-alkylthio groups or halogen atoms.

R$^1$ is preferably selected from alkyl, alkoxyalkyl, radicals from esters of $C_1$-$C_6$ fatty acids with $C_1$-$C_6$-alkanols, $C_3$-$C_9$-dialkyl ketones and epoxidized $C_3$-$C_9$-epoxyalkyl radicals, where R$^1$ may be substituted by 1 or 2 radicals which are identical or different and are selected from alkoxy, halogen, CN and CF$_3$. Preferred substituents of branched or unbranched alkyl or alkoxy radicals are selected from alkoxy groups, halogen atoms and CN; from esters of $C_1$-$C_6$ fatty acids with $C_1$-$C_6$-alkanols, from alkoxy groups, halogen atoms, CN and CF$_3$; and, for $C_3$-$C_9$-dialkyl ketones, from alkoxy groups, halogen atoms and CN.

The main chain of the radical R$^1$ has, in particular, a length of from 3 to 12, especially 6 to 10, preferably 6 to 8 members (carbons, oxygens and/or sulfurs). Particularly preferred radicals R$^1$ are selected from

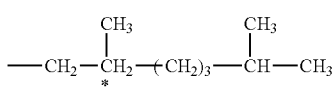

2,6-dimethylheptyl

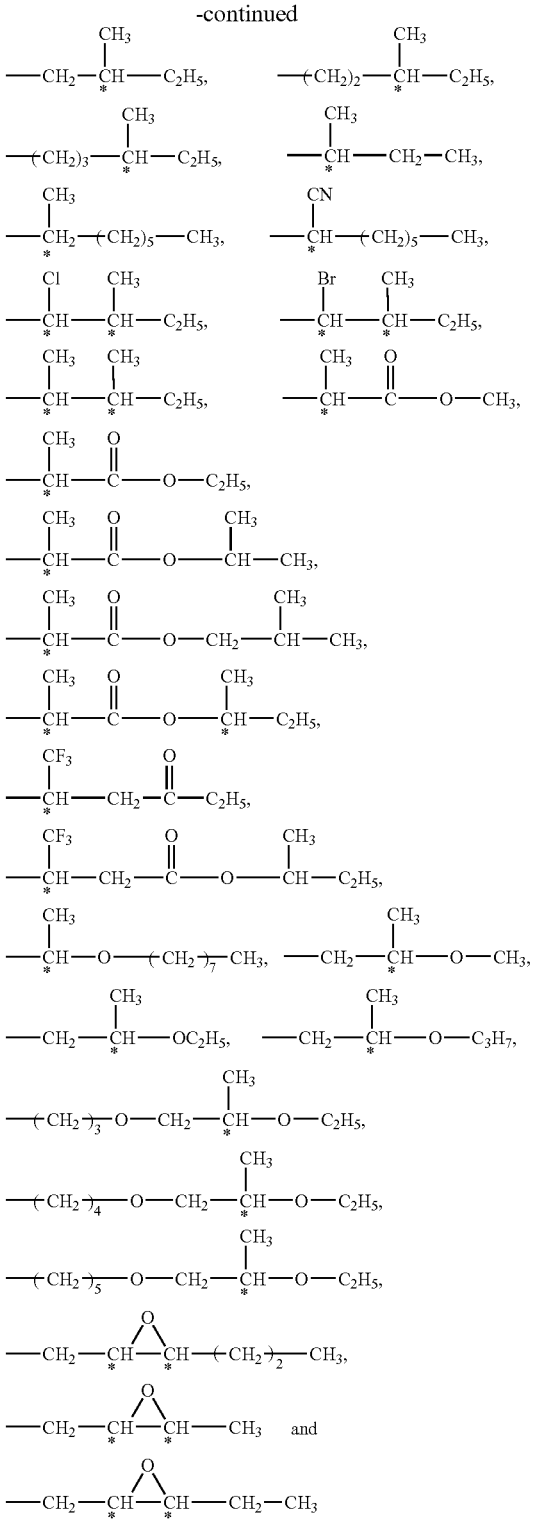

With very particular preference, component III of the copolyisocyanates that can be employed is derived from 2,6-dimethylheptyl isocyanate.

The radical R$^2$ of the copolyisocyanates that can be employed is preferably selected from $C_3$-$C_{11}$-alkenyl radicals, $C_4$-$C_{11}$-vinyl ether radicals (=vinyl $C_2$-$C_9$-alkyl ethers), ethylenically unsaturated $C_3$-$C_{11}$ carboxylic acid radicals and esters of ethylenically unsaturated $C_3$-$C_6$ monocarboxylic acids with $C_2$-$C_6$-alkanols, the linkage to the nitrogen taking place via the alkanol residue of the ester. The radical is with particular preference selected from methyl acrylate, ethyl acrylate, propyl acrylate, n-butyl acrylate, isobutyl acrylate, 2-ethylhexyl acrylate, methyl methacrylate, ethyl methacrylate, propyl methacrylate, n-butyl methacrylate, isobutyl methacrylate, and 2-ethylhexyl methacrylate, especially from ethyl acrylate or ethyl methacrylate.

The radical $R^3$ preferably has the same definitions as the radical $R^1$. However, it is achiral, i.e. it has no center of chirality or is in the form of a racemic mixture.

With particular preference, the main chain of the radical $R^3$ has a length of from 4 to 12, in particular 6 to 10, preferably 6 to 8 members (carbons, oxygens and/or sulfurs). Component V of the copolyisocyanates of the invention is, with very particular preference, derived from n-hexyl isocyanate, n-heptyl isocyanate or n-octyl isocyanate.

Components III, IV and V are preferably present in a molar ratio III:IV:V of about 1 to 20:1 to 20:50 to 98, in particular about 5 to 15:5 to 15:65 to 90, and, with particular preference, about 15:10:75.

The units III, IV and V can be distributed randomly in the copolyisocyanates which can be employed.

Suitable polymers of group e) are chiral nematic polyesters having flexible chains and comprising isosorbide, isomannide and/or isoidide units, preferably isosorbide units, and also comprising at least one chain-flexibilizing unit selected from (and derived from)
(a) aliphatic dicarboxylic acids,
(b) aromatic dicarboxylic acids with a flexible spacer,
(c) α,ω-alkanoids,
(d) diphenols with a flexible spacer, and
(e) condensation products of a polyalkylene terephthalate or polyalkylene naphthalate with an acylated diphenol and with an acylated isosorbide, as are described in DE-A-197 04 506.

The polyesters are noncrystalline and form stable Grandjean textures which can be frozen in on cooling to below the glass transition temperature. The glass transition temperatures of the polyesters, in turn, are despite the flexibilization above 80° C., preferably above 90° C. and, in particular, above 100° C.

The polyesters that can be employed include as units (a) preferably those of the formula

where n is from 3 to 15, especially 4 to 12, and with particular preference adipic acid;

as units (b) preferably those of the formula

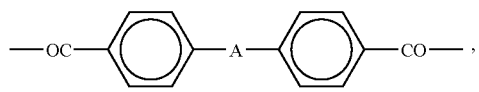

where
A is $(CH_2)_n$, $O(CH_2)_nO$ or $(CH_2)_o$—O—$(CH_2)_p$,
n is from 3 to 15, especially 4 to 12, with particular preference 4 to 10, and
o and p independently are from 1 to 7;

as units (c) preferably those of the formula

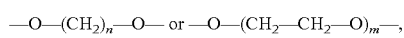

where
n is from 3 to 15, especially 4 to 12, with particular preference 4 to 10, and
m is from 1 to 10; and as units (d) preferably those of the formula

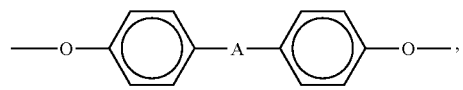

where
A is $(CH_2)_n$, $O(CH_2)_nO$ or $(CH_2)_o$—O—$(CH_2)_p$,
n is from 3 to 15, especially 4 to 12, with particular preference 4 to 10, and
o and p independently are from 1 to 7.

The polyesters that can be employed additionally comprise, as nonflexible acid component, preferably dicarboxylic acid units of the formula

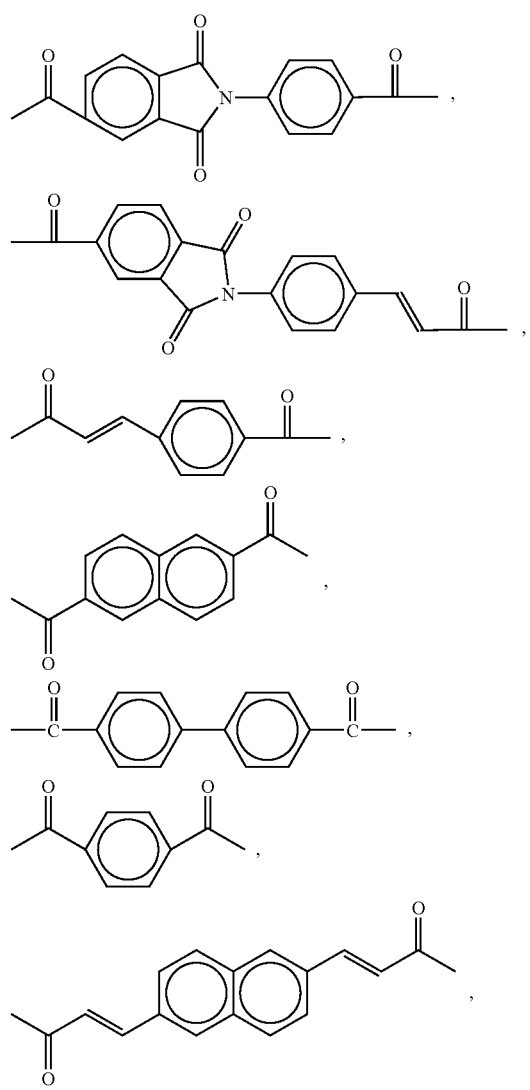

-continued

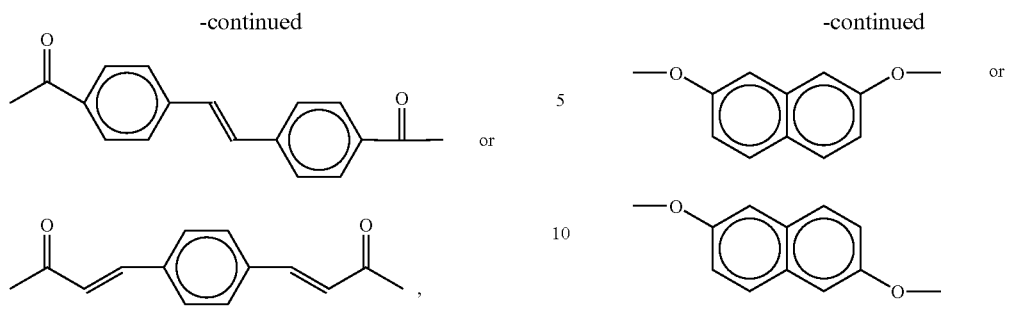
or and as nonflexible alcohol component diol units of the formula

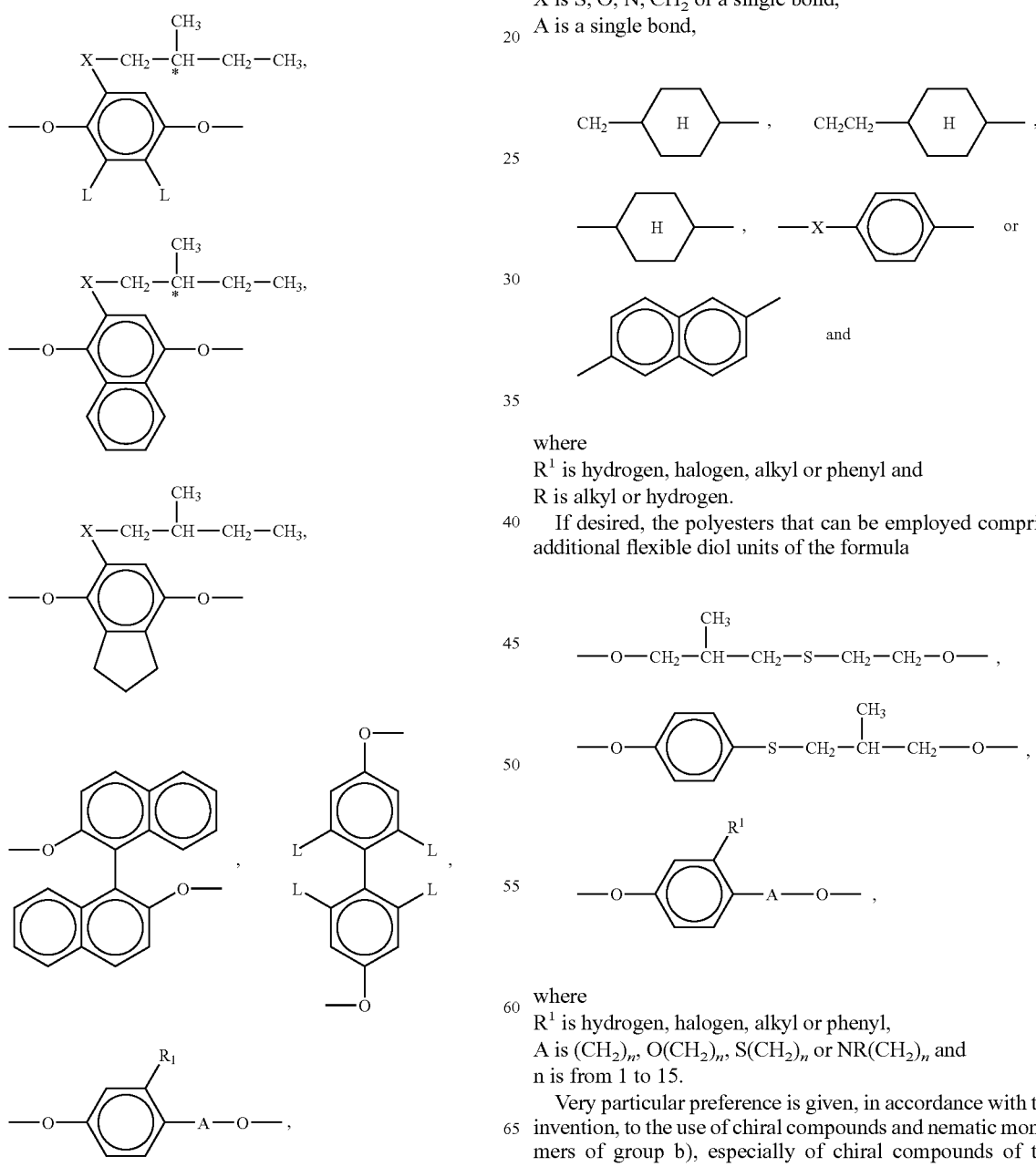

where
L is alkyl, alkoxy, halogen, COOR, OCOR, CONHR or NHCOR,
X is S, O, N, $CH_2$ or a single bond,
A is a single bond, where
$R^1$ is hydrogen, halogen, alkyl or phenyl and
R is alkyl or hydrogen.

If desired, the polyesters that can be employed comprise additional flexible diol units of the formula where
$R^1$ is hydrogen, halogen, alkyl or phenyl,
A is $(CH_2)_n$, $O(CH_2)_n$, $S(CH_2)_n$ or $NR(CH_2)_n$ and
n is from 1 to 15.

Very particular preference is given, in accordance with the invention, to the use of chiral compounds and nematic monomers of group b), especially of chiral compounds of the formula 2:

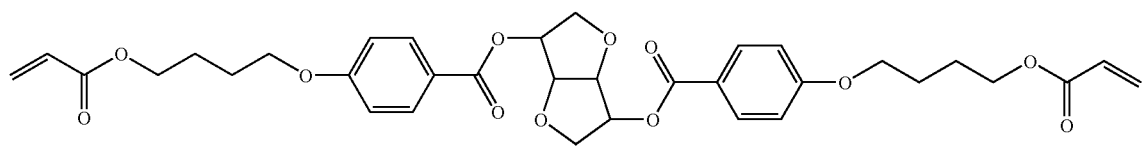
or of the formula 5:
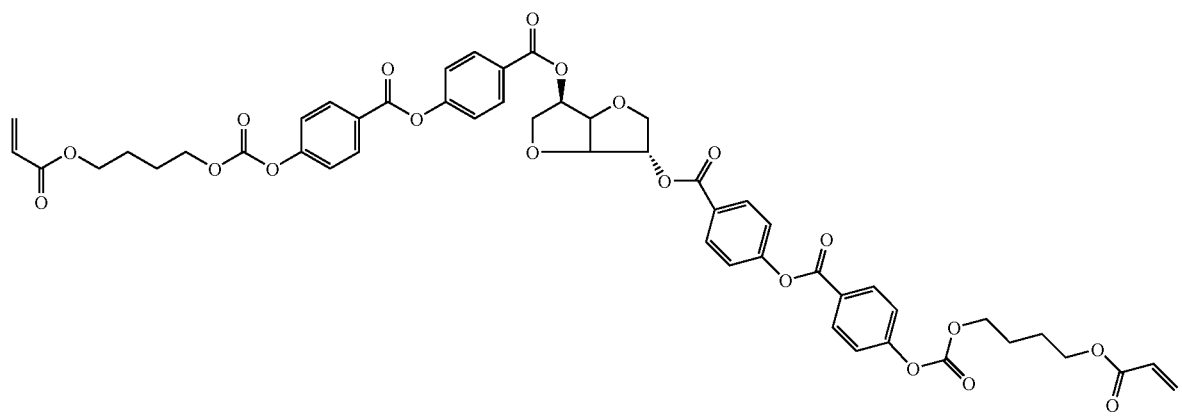
and nematic monomers of the formula 1:
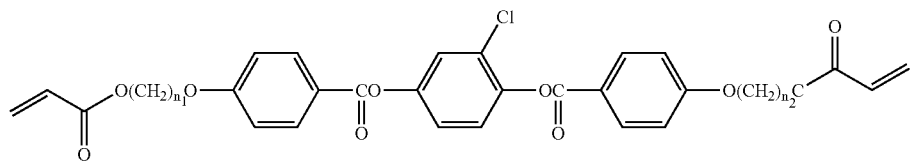
or preferably of the formula 3:
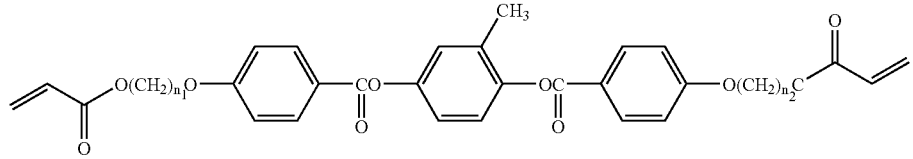
or with particular preference, of the formula 4:
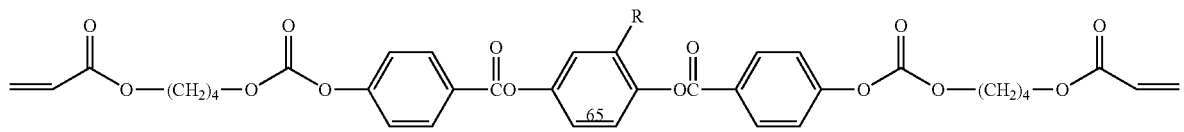

where $n_1$ and $n_2$ in formulae 1 and 3 are independently 4 or 6, R' in the formula 1 is H or Cl and the monomers of the formula 1 or 3 are preferably employed as mixtures of the compounds with $n_1/n_2$=4/4, 4/6, 6/4 or 6/6, and R in formula 4 is H, Cl or $CH_3$. It is also possible in accordance with the invention, however, to employ other cholesteric mixtures, examples being the mixtures disclosed in EP-A-686 674.

Gain media may be prepared from solutions using inert diluents such as, e.g. for mixtures a) or b) linear or branched esters, especially acetic esters, cyclic ethers and esters, alcohols, lactones, aliphatic and aromatic hydrocarbons, such as toluene, xylene and cyclohexane, and also ketones, amides, N-alkylpyrrolidones, especially N-methylpyrrolidone, and in particular tetrahydrofuran (THF), dioxane and methyl ethyl ketone (MEK).

According to a preferred embodiment of the invention said cholesteric mixtures further comprise at least one crosslinking agent. Examples of suitable cross linking agents include as described in U.S. Pat. No. 08,834,745. Examples of such crosslinking agents are

- esters of α,β-unsaturated mono- or dicarboxylic acids, especially $C_3$-$C_6$ mono- or dicarboxylic acids, with $C_1$-$C_{12}$-alkanols, $C_2$-$C_{12}$-alkanediols or their $C_1$-$C_6$-alkyl ethers and phenylethers, for example the acrylates and methacrylates, hydroxyethyl or hydroxypropyl acrylate or methacrylate, and 2-ethoxyethyl acrylate or methacrylate;
- vinyl $C_1$-$C_{12}$-alkyl ethers, such as vinyl ethyl, vinyl hexyl or vinyl octyl ether;
- vinylesters of $C_1$-$C_{12}$ carboxylic acids, such as vinyl acetate, vinyl propionate, vinyl laurate;
- $C_3$-$C_9$ epoxides, such as 1,2-butylene oxide, styrene oxide;
- N-vinylpyrrolidone, N-vinylcaprolactam, N-vinylformamide;
- vinylaromatic compounds, such as styrene, α-methylstyrene, chlorostyrene, and
- compounds having two or more, preferably at least three polymerizable ethylenically unsaturated double bonds, such as di- or triesters of di- or triols (including polyethylene glycols) with acrylic or methacrylic acid; mono-, di- or triesters of α,β-unsaturated mono-, di- or tricarboxylic acids with vinyl or allyl or methallyl alcohol; di- or triethers of di- or triols with vinyl or allyl or methallyl alcohol; or di- or trivinylbenzene, or di- or triallylbenzene, or di- or trivinyloxybenzene, or di- or triallyloxybenzene, or N-triallylisocyanurate.

Examples of preferred crosslinking agents are 2-ethoxyethyl acrylate, diethylene glycol diacrylate, ethylene glycol dimethacrylate, diethylene glycol dimethacrylate, triethylene glycol dimethacrylate, trimethylol propane di(meth)acrylate or tri(meth)acrylate, diethylene glycol monomethyl ether acrylate, phenoxyethyl acrylate, 5-acryloxymethyl-1,2-dioxane, tetrahydrofurfuryl acrylate, tetraethylene glycol dimethacrylate, or particularly preferred, styrene and 1,3,5 triallyloxybenzene.

If desired, water can also be added to the diluent, or can even be employed as the sole diluent. Water is the preferred diluent, if the gain medium of the invention is prepared from emulsion.

For photochemical polymerization, the crosslinkable or polymerizable mixture may include customary commercial photoinitiators. For curing by electron beams, such initiators are not required. Examples of suitable photoinitiators are isobutyl benzoin ether, 2,4,6-trimethylbenzoyldiphenylphosphine oxide, 1-hydroxycyclohexyl phenyl ketone, 2-benzyl-2-dimethylamino-1-(4-morpholinophenyl)furan-1-one, mixtures of benzophenone and 1-hydroxycyclohexyl phenyl ketone, 2,2-dimethoxy-2-phenylacetophenone, perfluorinated diphenyltitanocenes, 2-methyl-1-(4-[methylthio]phenyl)-2-(4-morpholinyl)-1-propanone, 2-hydroxy-2-methyl-1-phenylpropan-1-one, 4-(2-hydroxyethoxy)phenyl 2-hydroxy-2-propyl ketone, 2,2-diethoxyacetophenone, 4-benzoyl-4'-methyldiphenyl sulfide, ethyl 4-(dimethylamino)benzoate, mixtures of 2-isopropylthioxanthone and 4-isopropylthioxanthone, 2-(dimethylamino)ethyl benzoate, d,1-camphorquinone, ethyl-d,1-camphorquinone, mixtures of benzophenone and 4-methylbenzophenone, benzophenone, 4,4'-bisdimethylaminobenzophenone, ($\eta^5$-cyclopentadienyl) ($\eta^6$-isopropylphenyl) iron(II) hexafluorophosphate, triphenylsulfonium hexafluorophosphate or mixtures of triphenylsulfonium salts, and also butanedioldi-acrylate, dipropylene glycol diacrylate, hexanediol diacrylate, 4-(1,1-dimethylethyl)cyclohexyl acrylate, trimethylolpropane triacrylate and tripropylene glycol diacrylate.

According to one preferred embodiment of the present invention, the liquid crystal polymer is an elastomeric material. It has been found that cholesteric liquid crystal elastomers exhibit a spontaneous and uniform orientation of the helical structure. Such materials do not need any mechanical support for a stable orientation of the helical structure. One particular advantage of cholesteric liquid crystal elastomers resides in the fact that the helical structure can be modified by external mechanical fields. Consequently laser emission can be tuned by external mechanical deformations. The elastomeric properties of the gain medium are essentially controlled by the concentration of a crosslinking agent and/or by the polymerization conditions.

According to one embodiment of the invention, the laser gain medium is comprised of at least three layers, with the active species, e.g. the laser dye, being disposed between a adjacent cholesteric layers acting as optical feedback means. Thus, laser light generated in the intermediate layer can freely propagate throughout the intermediate layer and is subsequently reflected in the adjacent cholesteric layers. Similar arrangements are denoted "distributed Bragg reflectors (DBR)" in diode laser assemblies. The intermediate layer may for instance be a polymer layer doped with a suitable laser dye or any other active medium which is readily coatable with cholesteric layers. It is known that the reflectance of cholesteric layers depend on the layer thickness. Thus, one cholesteric layer may be adapted to provide for almost 100% reflectance while the other cholesteric layer may be less reflective in order to obtain a directional output of the laser beam.

According to another embodiment of the invention, the active species may be comprised in the cholesteric layer. Thus, in one variant of the invention, the gain medium merely consists of a single cholesteric layer having a suitable laser dye dissolved therein. Such a gain media can be prepared in various ways. E.g., a solution comprising the above-mentioned monomers and a laser dye may be applied to a substrate and polymerized after evaporation of the solvent. Laser dyes may also be added to the polymerized cholesteric layer, e.g. by swelling the cholesteric polymer with a dye solution and subsequent evaporation of the solvent.

In another variant, the active species can be covalently bound to a compound of the cholesteric layer. The laser dye may, for instance, be a suitable reactive monomer co-polymerized with nematic and achiral compounds. The laser dye can also be, for instance, a side group of one of the monomeric compounds forming the cholesteric layer.

Rather than a conventional laser dye, the active species may also be a polymeric material capable of exhibiting stimulated emission of light. Conjugated polymers such as poly(p- phenylene vinylene) as described e.g. by Kallinger et al. in *Adv. Mater.* 1998, 10, pages 920 et seq. are preferred active species for gain media of the present invention. Preferably, a layer of the conjugated polymer material is prepared and cholesteric reflective layers are disposed on both sides of the conjugated polymer layer.

However, due to a large variety of available compounds, laser dyes are the preferred active species of the present invention. Suitable laser dyes are described in *Uhlmann's Encyclopedia of Industrial Chemistry*, 50th edition, volume A 15, pages 151 et seq. Suitable dyes comprise polyphenyl and heteroaromatic compounds, stilbenes, coumarins, xanthene or methine dyes.

It is known that the reflectance band of a cholesteric layer is bound by edges at $\lambda_e = n_e P$ and $\lambda_0 = n_0 P$, with $n_e$ and $n_0$ being the refractive indices, respectively along and perpendicular to the molecular director and P being the pitch of the helical structure. With the reflectance band of the cholesteric layer being tuned to the fluorescence emission spectrum of the dye, below lasing threshold, an alteration of the emission spectrum and an enhancement of emission at the reflection band edges is observed. Light enission from dye molecules experiences a distributed feedback at the periodicity of $n_0 P = \lambda_0$. Thus above lasing threshold, a narrow lasing line is observed essentially at or close to $\lambda_0$.

Consequently, in the gain medium of the present invention, the active species can be stimulated to emit laser light within a predetermined wavelength range corresponding essentially to its fluorescence emission spectrum. The cholesteric layer is selected such that the edge of its reflection band falls within the emission spectrum of the active species.

The present invention is also directed to a solid state dye laser comprising a laser gain medium as described above and pump means adapted to excite said laser gain medium. Preferred pump means are optical pump means such as flash lights or pump lasers. Any source capable of emitting electromagnetic radiation with a frequency higher than the laser emission frequency will be a suitable pump source. Preferred pump lasers include continuous wave lasers, such as argon or krypton lasers, or puls lasers such as nitrogen or excimer lasers or frequency doubled Nd:YAG lasers.

The above and other features and advantages of this invention will be more readily apparent from a reading of the following detailed description of various aspects of the invention taken in conjunction with the accompanying drawings.

DETAILED DESCRIPTION PREFERRED EMBODIMENTS OF THE INVENTION

Figure 1:
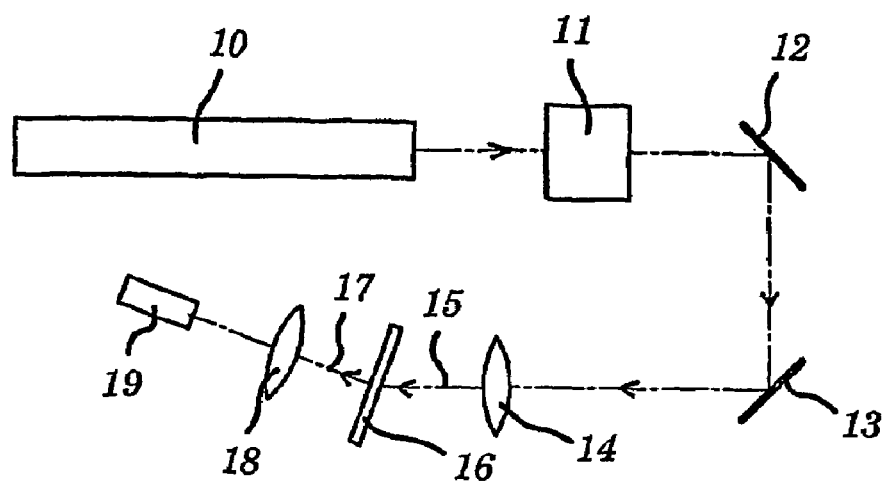
FIG. 1 shows schematically a preferred embodiment of solid-state dye laser system of the present invention.

FIG. 1 shows a preferred embodiment of the solid state dye laser of the present invention. The solid state dye laser comprises pump means 10, for instance frequency doubled mode-locked Nd:YAG laser. Suitable means 11 to control the pulse energy of the pump laser 10, e.g. a polarizer, half-wave plate assembly, maybe provided. Optical means, e.g. mirrors 12, 13 and a lense assembly 14, are used to focus the pump beam 15 on the gain medium 16 of the present invention. A collector lens 17 is used to collect the emitted laser light, e.g. in fiber optics wave guide 18. As can be seen, conventional longitudinal optical pumping or "end pumping" is employed, i.e. the pump laser beam is incident along the length of the gain medium parallel to the propagation direction of the laser emission. The dye-doped gain medium is typically 5-100 micron thick and dye concentration in the gain medium is typically $10^{-4}$ to $10^{-2}$ molar.

Figure 2:
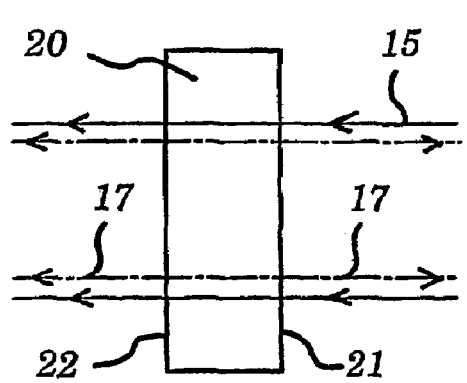
FIG. 2 depicts a schematic view of a first embodiment of the gain medium of the invention.

In FIG. 2, a cross-sectional view of first embodiment of the gain medium 16 of the invention is depicted. The gain medium consists of a single dye-doped cholesteric layer 20. Longitudinal optical pumping is employed. The pump laser beam 15 and the dye laser beam 17 travel co-linearly within the laser gain medium 20 as shown by the arrows. Without further modification, the dye laser beam is emitted from both surfaces 21, 22 of the cholesteric layer 20.

Figure 3:
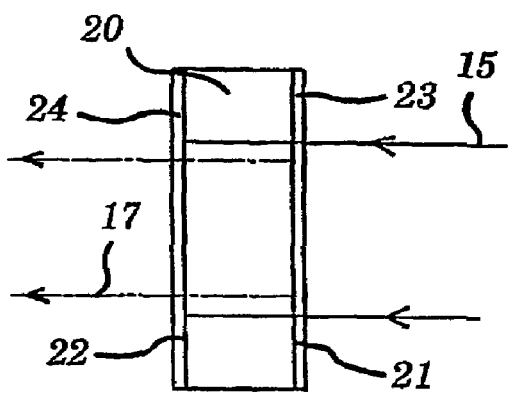
FIG. 3 depicts a variant of the gain medium of FIG. 2.

In FIG. 3, a variant of the gain medium of FIG. 2 is depicted. Surface 21 of gain medium 20 is coated with a high reflectance dichroic coating 23 that reflects substantially at dye laser wavelength but transmits at pump laser wavelengths. Surface 22 of gain medium 20 is coated with a high-reflectance dichroic coating 24 that reflects substantially at pump wave length but transmits at dye laser wave length. Thus, the specific arrangement of FIG. 3 improves a directional emission of dye laser light which can only exit gain medium 20 via surface 22.

Figure 4:
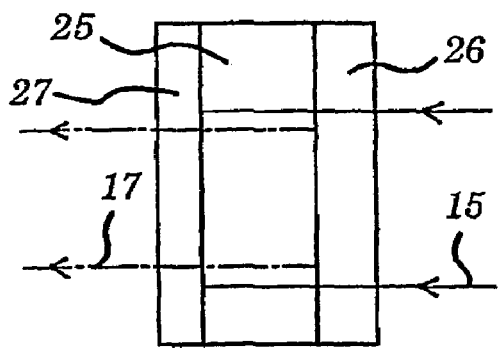
FIG. 4 depicts a schematic view of a second embodidment of the gain medium of the invention.
Figure 5:
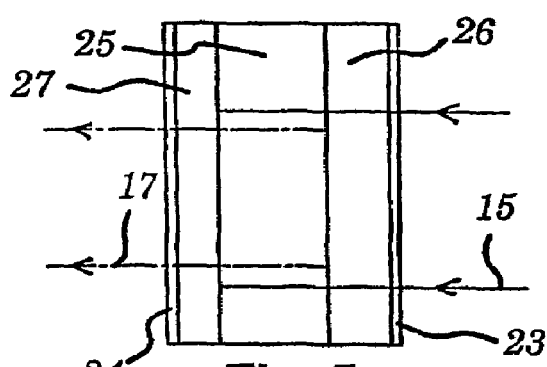
FIG. 5 depicts a variant of the gain medium of FIG. 4.

The embodiments of FIGS. 4 and 5 correspond to the embodiments of FIGS. 2 and 3, respectively, except that gain medium 20 is comprised of three layers, namely an intermedium active polymeric layer 25 which hosts the laser dye but which itself does not exhibit distributed feedback. Layer 25 is interposed between two cholesteric layers 26, 27 which act as distributed reflectors for laser light emitted in the active layer 25. Reflectance of layer 27 is, however reduced as compared to the reflectance of layer 26 thus providing for a directional output of a dye laser beam 17.

Directional output of laser light may be further improved if additional reflective coatings 23, 24 are employed as described in FIG. 5. Reflective coatings 23 and 24 correspond to the reflective coatings 23, 24 of the embodiment of FIG. 3.

EXAMPLE 1

A cholesteric liquid crystalline elastomeric layer was prepared as follows: A network was synthesized via a hydrosilylation reaction of 100 mol/% poly[oxv(methylsilylene)] with both 72 mol/% of an achiral nematogenic monomer of formula

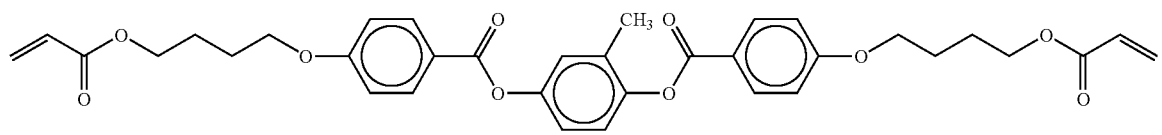

18 mol/% of a chiral cholesterylcarbonate of formula

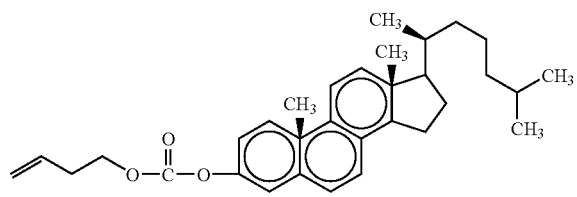

and 10 mol/% of a crosslinking agent of formula

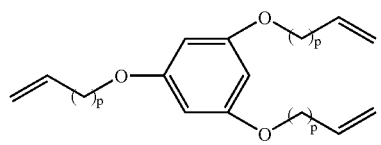

p can be either 0 or 1.

The synthesis consists of two steps, which result in an overall oblate chain conformation that causes a uniform orientation of the helix axis in the network, Firstly, a weakly crosslinked gel is synthesized; the crosslinking reaction is incomplete at this stage. The statistically averaged network chain conformation is assumed to be spherical here. Secondly, an anisotropic deswelling procedure is implemented, where the gel, swollen with the solvent toluene, is allowed to deswell only in one direction, while keeping the dimensions in the two perpendicular directions to this constant. This anisotopic deswelling is equivalent to a uniaxial compression (or biaxial stretch), which gives rise to the oblate chain conformation. Due to the coupling between network chain conformation and liquid crystalline order, the helix axis becomes aligned perpendicular to the directions along which he dimensions were held constant during the deswelling. Under these conditions, the crosslinking reaction is completed, resulting in a highly ordered macroscopic cholesteric liquid single crystal elastomer. To achieve lasing, the laser dye DCM (4-(dicyanomethylene)-2-methyl-6-(4-dimethylamino styryl)-4 H-pyran) is dissolved in the cholesteric layer. In order to dope the elastomer with purified DCM, the network is simply swollen in toluene containing the dye and subsequently dried. The dye conentration in loluene was such that when the solvent was removed. 0.2 wt/% of DCM remained dissolved in the cholesteric layer. With the above concentration of the chiral component, the network shows a selective reflection of left circularly polarized light with reflection maximum at $\lambda_R$=590 nm.

Figure 6:
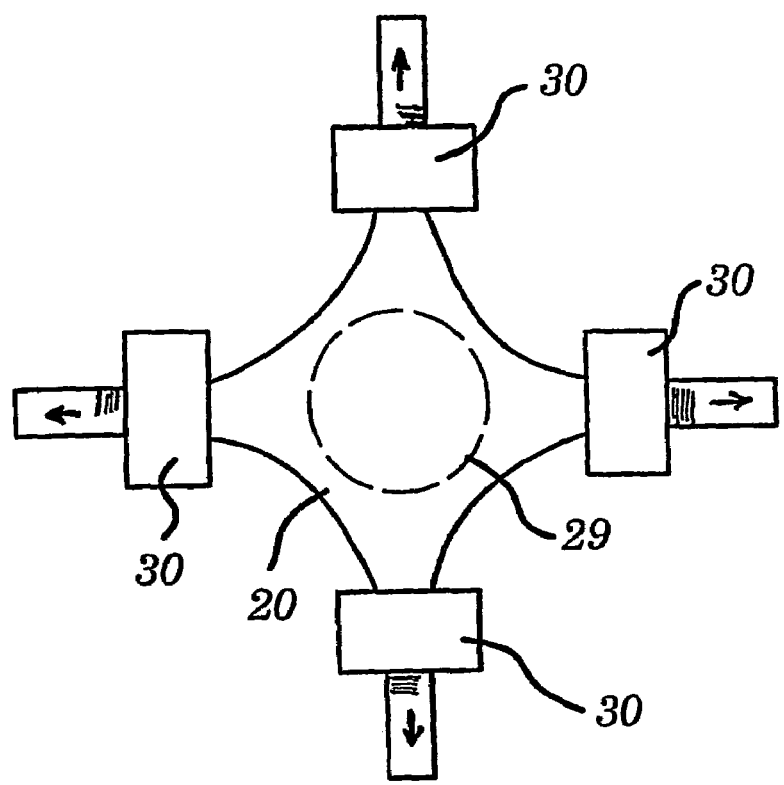
FIG. 6 shows a free-standing dyed cholesteric layer which is corner mounted on the movable faces of a four-jaw chuck.

To carry out the lasing experiment, a free standing dyed cholesteric layer 20 is corner mounted on the movable faces 30 of a four-jaw chuck over an optical port 29, as shown in FIG. 6. The pump beam is a frequency doubled mode-locked Nd:YAG laser with 35 ps pulses at a wavelength of $\lambda$=532 nm. The experimental setup corresponds to the schematic drawing of FIG. 1.

The pulse energy was controlled with a polarizer and half-wave plate. The pump beam was focused on the sample using a f=20 cm, 2.5 cm diameter lens, the beam diameter at the sample was 300 μm. The emitted light was collected and focused to the entrance slit of a TRIAX 550 (Jovin Yvon-Spex) spectrometer. The emission was recorded with an i-Spectrum One intensified CCD (JovinYvon-Spex) detector, operated in the continuous mode. The samples showed, under ps excitation at 532 nm, fluorescence line narrowing as function of pump pulse energy. Lasing was observed above a pump threshold of approx. 280 μJ. By appling a biaxial distortion to the sample, it was possible to shift the laser emission wavelength in a range between 544 and 630 nm. Observed line widths was approx. 3.5 Å.

EXAMPLE 2

Similar experiments as in example 1 were carried out on a different cholesteric layer.

The cholesteric layer of example 2 was prepared from a solution of 94,3 wt/% of archiral nematic monomers of formula

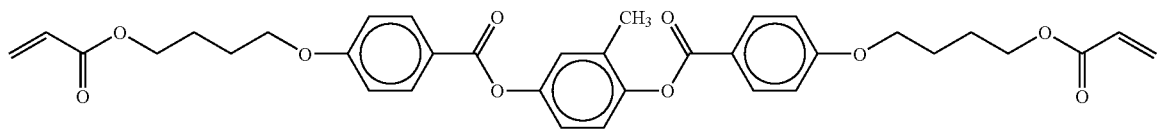

and 3,9 wt/% of chiral monomers of formula

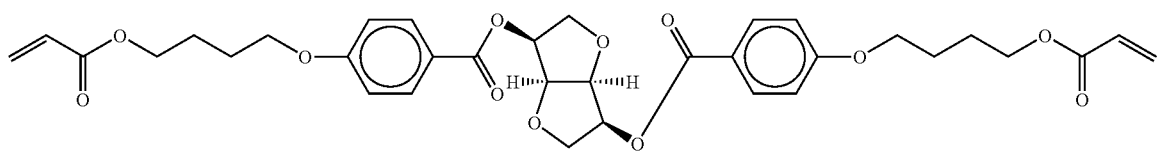

dissolved in THf, further including 1,5 wt/% photoinitiator (IG 184, Ciba-Geigy) and 0,3 wt/% DCM.

The solvent was evaporated and the mixture was placed at 65° C. between two polyimide coated glass plates having a clearance of 15 μm. The sample was kept at 65° C. for 30 minutes to allow for the development a planar texture of the cholesteric phase. Subsequently, polymerization was initiated. A defect free cholesteric network having a reflection band at 580 nm is thus obtained.

We claim:
1. A laser gain medium, comprising:
   at least one active species adapted to be stimulated to emit laser light within a predetermined wavelength range,
   optical feedback means defining a resonator for said laser light, said feedback means comprising at least one substantially solid cholesteric layer having a substantially planar texture exhibiting selective reflection of light defined by a reflection band tuned to said predetermined wavelength range, said cholesteric layer being obtained from reactive cholesteric mixtures selected from mixtures comprising:
   a) at least one cholesteric, polymerizable monomer; or
   b) at least one achiral, nematic, polymerizable monomer and one chiral compound in an inert diluent; or
   c) at least one cholesteric, crosslinkable oligomer or polymer selected from the group comprising cholesteric cellulose derivatives, propargyl-terminated cholesteric polyesters or polycarbonates, crosslinkable oligo- or polyorgano-siloxanes; or
   d) crosslinkable cholesteric copolyisocyanates in a polymerizable diluent; or
   e) chiral nematic polyesters having flexible chains whose cholesteric phase can be frozen in by rapid cooling to below the glass transition temperature,
   werein said mixtures b) do not comprise mixtures of an achiral, nematic, polymerizable monomer having a mesogenic group comprising

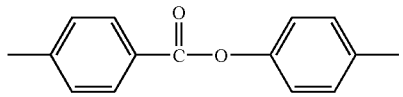

and a chiral cholesterylcarbonate and a crosslinking agent;
   wherein said monomer of mixture a) is a chiral, liquid-crystalline, polymerizable monomer of the formula I $$[Z^1\text{-}Y^1\text{-}A^1\text{-}Y^2\text{-}M^1\text{-}Y^3\text{-}]_n X \qquad (1)$$

where
$Z^1$ is a polymerizable group or a radical which carries a polymerizable group,
$Y^1, Y^2, Y^3$ independently are chemical bonds, oxygen, sulfur,

—CO—O—, —O—CO—, —O—CO—O—,

—CO—N(R)— or —N(R)—CO—, $A^1$ is a spacer,
$M^1$ is a mesogenic group,

X is an n-valent chiral radical,
R is hydrogen or $C_1$-$C_4$-alkyl,
n is 1 to 6,
and $Z^1, Y^1, Y^2, Y^3, A^1$ and $M^1$ can be identical or different if n is greater than 1;
wherein said cholesteric mixture b) comprises
at least one achiral, nematic, polymerizable monomer of the formula II $$Z^2\text{-}Y^4\text{-}A^2\text{-}Y^5\text{-}M^2\text{-}Y^6\text{-}A^3\text{-}(\text{-}Y^7\text{-}Z^3)_n \qquad (III)$$

where
$Z^2, Z^3$ are identical or different polymerizable groups or radicals which contain a polymerizable group,
n is 0 or 1
$Y^4, Y^5, Y^6, Y^7$ independently are chemical bonds, oxygen, sulfur,

—CO—O—, —O—CO—, —O—CO—O—,

—CO—N(R)— or —N(R)—CO—, $A^2, A^3$ are identical or different spacers and
$M^2$ is a mesogenic group,
and at least one chiral compound of formula Ia $$[Z^1\text{-}Y^1\text{-}A^1\text{-}Y^2\text{-}M^a\text{-}Y^3\text{-}]_n X \qquad (Ia),$$

or of formula Ib $$Z^1\text{-}Y^1\text{-}A^1\text{-}Y^2\text{-}X^2 \qquad (Ib),$$

where $Z^1, Y^1, Y^2, Y^3, A^1$, X and n are as defined, $M^a$ is a divalent radical which comprises at least one heterocyclic or isocyclic ring system, and $X^2$ is a cholesteryl radical or a derivative thereof.

2. The laser gain medium of claim 1, wherein said cholesteric mixtures further comprise at least one crosslinking agent.

3. The laser gain medium of claim 1, wherein said cholesteric liquid crystal polymer is an elastomer.

4. The laser gain medium of claim 1, wherein at least one intermediate layer comprising said active species is disposed between adjacent layers of said cholesteric layers.

5. The laser gain medium of claim 1, wherein said active species is comprised in said cholesteric layer.

6. The laser gain medium of claim 5, wherein said active species is dissolved in said cholesteric layer.

7. The laser gain medium of claim 5, wherein said active species is bound to a compound of said cholesteric layer.

8. The laser gain medium of claim 1, wherein said active species is a conjugated polymer.

9. The laser gain medium of claim 1, wherein said active species is a laser dye.

* * * * *